US011562985B2

(12) United States Patent
Liu et al.

(10) Patent No.: US 11,562,985 B2
(45) Date of Patent: Jan. 24, 2023

(54) BONDED SEMICONDUCTOR DEVICES HAVING PROCESSOR AND DYNAMIC RANDOM-ACCESS MEMORY AND METHODS FOR FORMING THE SAME

(71) Applicant: YANGTZE MEMORY TECHNOLOGIES CO., LTD., Wuhan (CN)

(72) Inventors: Jun Liu, Wuhan (CN); Weihua Cheng, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 149 days.

(21) Appl. No.: 17/157,776

(22) Filed: Jan. 25, 2021

(65) Prior Publication Data

US 2021/0151414 A1 May 20, 2021

Related U.S. Application Data

(60) Division of application No. 16/669,435, filed on Oct. 30, 2019, now Pat. No. 11,430,766, which is a (Continued)

(30) Foreign Application Priority Data

Apr. 15, 2019 (WO) ................ PCT/CN2019/082607

(51) Int. Cl.
*H01L 27/11* (2006.01)
*H01L 25/065* (2006.01)
(Continued)

(52) U.S. Cl.
CPC .......... *H01L 25/0657* (2013.01); *H01L 21/78* (2013.01); *H01L 24/08* (2013.01);
(Continued)

(58) Field of Classification Search
CPC combination set(s) only.
See application file for complete search history.

(56) References Cited

U.S. PATENT DOCUMENTS 6,055,655 A    4/2000  Momohara
9,558,945 B2   1/2017  Fukuzumi et al.
(Continued)

FOREIGN PATENT DOCUMENTS

CN    1190262 A    8/1998
CN    1542974 A    11/2004
(Continued)

OTHER PUBLICATIONS

International Search Report issued in corresponding International Application No. PCT/CN2019/105290, dated Jan. 21, 2020, 5 pages.
(Continued)

*Primary Examiner* — Moin M Rahman
(74) *Attorney, Agent, or Firm* — Bayes PLLC

(57) ABSTRACT

Embodiments of semiconductor devices and fabrication methods thereof are disclosed. In an example, a method for forming a semiconductor device is disclosed. First semiconductor structures are formed on a first wafer. At least one of the first semiconductor structures includes a processor, an array of SRAM cells, and a first bonding layer including first bonding contacts. Second semiconductor structures are formed on a second wafer. At least one of the second semiconductor structures includes an array of DRAM cells and a second bonding layer including second bonding contacts. The first wafer and the second wafer in are bonded in a face-to-face manner, such that the at least one of the first semiconductor structures is bonded to the at least one of the second semiconductor structures. The first bonding contacts of the first semiconductor structure are in contact with the second bonding contacts of the second semiconductor struc-
(Continued)

ture at a bonding interface. The bonded first and second wafers are diced into dies. At least one of the dies includes the bonded first and second semiconductor structures.

20 Claims, 16 Drawing Sheets

Related U.S. Application Data continuation of application No. PCT/CN2019/105290, filed on Sep. 11, 2019.

(51) Int. Cl.
*H01L 21/78* (2006.01)
*H01L 23/00* (2006.01)
*H01L 25/18* (2006.01)
*H01L 25/00* (2006.01)

(52) U.S. Cl.
CPC .............. *H01L 24/80* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2225/06524* (2013.01)

(56) References Cited

U.S. PATENT DOCUMENTS

| | | | |
|---|---|---|---|
| 9,691,782 | B1 | 6/2017 | Hwang et al. |
| 9,935,087 | B2 | 4/2018 | Zhai et al. |
| 10,283,493 | B1 | 5/2019 | Nishida |
| 2008/0155196 | A1 | 6/2008 | Black et al. |
| 2010/0295136 | A1 | 11/2010 | Or-Bach et al. |
| 2011/0049694 | A1 | 3/2011 | Chandrasekaran et al. |
| 2011/0101537 | A1 | 5/2011 | Barth et al. |
| 2012/0170345 | A1 | 7/2012 | Choi et al. |
| 2013/0277749 | A1 | 10/2013 | Kura et al. |
| 2014/0319694 | A1 | 10/2014 | Graves-Abe et al. |
| 2015/0021789 | A1* | 1/2015 | Lin .................... H01L 24/02 438/118 |
| 2015/0340366 | A1 | 11/2015 | Lim et al. |
| 2016/0079164 | A1 | 3/2016 | Fukuzumi et al. |
| 2017/0053897 | A1 | 2/2017 | Lai et al. |
| 2017/0263620 | A1 | 9/2017 | Lee |
| 2018/0046908 | A1 | 2/2018 | Cox et al. |
| 2018/0137294 | A1 | 5/2018 | Van Antwerpen et al. |
| 2018/0204820 | A1 | 7/2018 | Zhai et al. |
| 2018/0210830 | A1 | 7/2018 | Malladi et al. |
| 2018/0261623 | A1 | 9/2018 | Higashi et al. |
| 2019/0043836 | A1 | 2/2019 | Fastow et al. |
| 2019/0081069 | A1 | 3/2019 | Lu et al. |
| 2019/0123022 | A1 | 4/2019 | Teig et al. |
| 2019/0273090 | A1 | 9/2019 | Fukuzumi et al. |
| 2019/0363079 | A1 | 11/2019 | Thei et al. |
| 2020/0135266 | A1 | 4/2020 | Kumar et al. |
| 2021/0143124 | A1 | 5/2021 | Lin et al. |

FOREIGN PATENT DOCUMENTS

| | | |
|---|---|---|
| CN | 105097019 A | 11/2015 |
| CN | 105468569 A | 4/2016 |
| CN | 107658315 A | 2/2018 |
| CN | 108063097 A | 5/2018 |
| CN | 109148498 A | 1/2019 |
| CN | 109155301 A | 1/2019 |
| CN | 109545764 A | 3/2019 |
| CN | 110190056 A | 8/2019 |
| CN | 110192269 A | 8/2019 |
| TW | I478314 B | 3/2015 |
| TW | 201804332 A | 2/2018 |
| TW | 201913966 A | 4/2019 |
| TW | 201933578 A | 8/2019 |
| WO | 2019079625 A1 | 4/2019 |

OTHER PUBLICATIONS

Written Opinion of the International Searching Authority issued in corresponding International Application No. PCT/CN2019/105290, dated Jan. 21, 2020, 6 pages.
International Search Report issued in corresponding International Application No. PCT/CN2019/105292, dated Jan. 15, 2020, 5 pages.
Written Opinion of the International Searching Authority issued in corresponding International Application No. PCT/CN2019/105292, dated Jan. 15, 2020, 5 pages.
International Search Report issued in corresponding International Application No. PCT/CN2019/105291, dated Feb. 6, 2020, 4 pages.
Written Opinion of the International Searching Authority issued in corresponding International Application No. PCT/CN2019/105291, dated Feb. 6, 2020, 4 pages.
Extended European Search Report issued in corresponding European Application No. 19924862.6, dated Sep. 1, 2022, 15 pages.
Extended European Search Report issued in corresponding European Application No. 19927108.1, dated Aug. 18, 2022, 12 pages.
Extended European Search Report issued in corresponding European Application No. 19924773, dated Sep. 26, 2022, 10 pages.

* cited by examiner

100

101

BONDED SEMICONDUCTOR DEVICES HAVING PROCESSOR AND DYNAMIC RANDOM-ACCESS MEMORY AND METHODS FOR FORMING THE SAME

CROSS-REFERENCE TO RELATED APPLICATIONS

This application is division of U.S. application Ser. No. 16/669,435, filed on Oct. 30, 2019, entitled "BONDED SEMICONDUCTOR DEVICES HAVING PROCESSOR AND DYNAMIC RANDOM-ACCESS MEMORY AND METHODS FOR FORMING THE SAME," which is continuation of International Application No. PCT/CN2019/105290, filed on Sep. 11, 2019, entitled "BONDED SEMICONDUCTOR DEVICES HAVING PROCESSOR AND DYNAMIC RANDOM-ACCESS MEMORY AND METHODS FOR FORMING THE SAME," which claims the benefit of priority to International Application No. PCT/CN2019/082607, filed on Apr. 15, 2019, entitled "INTEGRATION OF THREE-DIMENSIONAL NAND MEMORY DEVICES WITH MULTIPLE FUNCTIONAL CHIPS," all of which are incorporated herein by reference in their entireties. This application is also related to U.S. application Ser. No. 16/669,445, filed on Oct. 30, 2019, entitled "BONDED SEMICONDUCTOR DEVICES HAVING PROCESSOR AND NAND FLASH MEMORY AND METHODS FOR FORMING THE SAME," and U.S. application Ser. No. 16/669,450, filed on Oct. 30, 2019, entitled "UNIFIED SEMICONDUCTOR DEVICES HAVING PROCESSOR AND HETEROGENEOUS MEMORIES AND METHODS FOR FORMING THE SAME," both of which are hereby incorporated by reference in their entireties.

BACKGROUND

Embodiments of the present disclosure relate to semiconductor devices and fabrication methods thereof.

In modern mobile devices (e.g., smartphones, tablets, etc.), multiple complicated system-on-chips (SOCs) are used to enable various functionalities, such as application processor, dynamic random-access memory (DRAM), Flash memory, various controllers for Bluetooth, Wi-Fi, global positioning system (GPS), frequency modulation (FM) radio, display, etc., and baseband processor, which are formed as discrete chips. For example, application processor typically is large in size including central processing units (CPUs), graphics processing units (GPUs), on-chip memory, accelerating function hardware, and other analog components.

SUMMARY

Embodiments of semiconductor devices and fabrication methods thereof are disclosed herein.

In one example, a semiconductor device includes a first semiconductor structure including a processor, an array of static random-access memory (SRAM) cells, and a first bonding layer including a plurality of first bonding contacts. The semiconductor device also includes a second semiconductor structure including an array of DRAM cells and a second bonding layer including a plurality of second bonding contacts. The semiconductor device further includes a bonding interface between the first bonding layer and the second bonding layer. The first bonding contacts are in contact with the second bonding contacts at the bonding interface.

In another example, a method for forming a semiconductor device is disclosed. A plurality of first semiconductor structures are formed on a first wafer. At least one of the first semiconductor structures includes a processor, an array of SRAM cells, and a first bonding layer including a plurality of first bonding contacts. A plurality of second semiconductor structures are formed on a second wafer. At least one of the second semiconductor structures includes an array of DRAM cells and a second bonding layer including a plurality of second bonding contacts. The first wafer and the second wafer in are bonded in a face-to-face manner, such that the at least one of the first semiconductor structures is bonded to the at least one of the second semiconductor structures. The first bonding contacts of the first semiconductor structure are in contact with the second bonding contacts of the second semiconductor structure at a bonding interface. The bonded first and second wafers are diced into a plurality of dies. At least one of the dies includes the bonded first and second semiconductor structures.

In still another example, a method for forming a semiconductor device is disclosed. A plurality of first semiconductor structures are formed on a first wafer. At least one of the first semiconductor structures includes a processor, an array of SRAM cells, and a first bonding layer including a plurality of first bonding contacts. The first wafer is diced into a plurality of first dies, such that at least one of the first dies includes the at least one of the first semiconductor structures. A plurality of second semiconductor structures are formed on a second wafer. At least one of the second semiconductor structures includes an array of DRAM cells and a second bonding layer including a plurality of second bonding contacts. The second wafer is diced into a plurality of second dies, such that at least one of the second dies includes the at least one of the second semiconductor structures. The first die and the second die are bonded in a face-to-face manner, such that the first semiconductor structure is bonded to the second semiconductor structure. The first bonding contacts of the first semiconductor structure are in contact with the second bonding contacts of the second semiconductor structure at a bonding interface.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
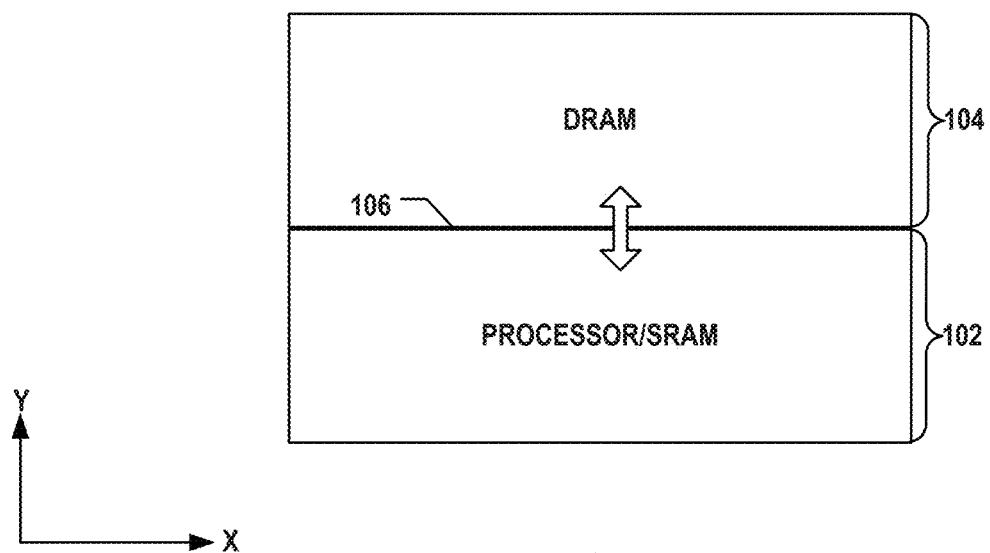
FIG. 1A illustrates a schematic view of a cross-section of an exemplary semiconductor device, according to some embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiments. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense.

Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, a "wafer" is a piece of a semiconductor material for semiconductor devices to build in and/or on it and that can undergo various fabrication processes before being separated into dies.

As modern processor (also known as "microprocessor") developed into more advanced generations, the cache size is playing an incrementally important role for processor performance enhancement. In some cases, cache occupied half or even more chip real estate in microprocessor chip. Also, the resistive-capacitive (RC) delay from the cache to the processor core logic could become significant to degrade performance. Moreover, a bus interface unit is needed to electrically connect the processor to external main memory. The bus interface unit itself, however, occupies additional chip area, and its electrical connection to main memory needs additional region for metal routing and introduces additional RC delay.

Various embodiments in accordance with the present disclosure provide a semiconductor device with a processor core, cache, and main memory integrated on a bonded chip to achieve better cache performance (faster data transfer with higher efficiency), wider data bandwidth, fewer bus interface units, and faster memory interface speed. The semiconductor device disclosed herein can include a first semiconductor structure having a processor core and SRAM (e.g., as cache) and a second semiconductor structure having DRAM (e.g., as main memory) bonded to the first semiconductor structure with a large number of short-distanced vertical metal interconnects instead of the peripherally-distributed, long-distanced metal routing, or even conventional through silicon vias (TSVs). In some embodiments, the cache module can be divided into smaller cache regions, distributing randomly according to bonding contact design.

As a result, shorter manufacturing cycle time with higher yield can be achieved due to less interactive influences from manufacturing processes of the processor wafer and the DRAM wafer as well as the known good hybrid bonding yield. The shorter connection distance between the processor and DRAM, such as from millimeter or centimeter-level to micrometer-level, can improve the processor performance with faster data transfer rate, improve processor core logic efficiency with wider bandwidth, and improve system speed.

FIG. 1A illustrates a schematic view of a cross-section of an exemplary semiconductor device 100, according to some embodiments. Semiconductor device 100 represents an example of a bonded chip. The components of semiconductor device 100 (e.g., processors/SRAM and DRAM) can be formed separately on different substrates and then jointed to form a bonded chip. Semiconductor device 100 can include a first semiconductor structure 102 including a processor and an array of SRAM cells. In some embodiments, the processor and SRAM cell array in first semiconductor structure 102 use complementary metal-oxide-semiconductor (CMOS) technology. Both the processor and the SRAM cell array can be implemented with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.) to achieve high speed.

The processor can include a specialized processor including, but not limited to, CPU, GPU, digital signal processor (DSP), tensor processing unit (TPU), vision processing unit (VPU), neural processing unit (NPU), synergistic processing unit (SPU), physics processing unit (PPU), and image signal processor (ISP). The processor can also include an SoC that combines multiple specialized processors, such as an application processor, baseband processor, and so on. In some embodiments in which semiconductor device 100 is used in mobile devices (e.g., smartphones, tablets, eyeglasses, wrist watches, virtual reality/augmented reality headsets, laptop computers, etc.), an application processor handles applications running in an operating system environment, and a baseband processor handles the cellular communications, such as the second-generation (2G), the third-generation (3G), the fourth-generation (4G), the fifth-generation (5G), the sixth-generation (6G) cellular communications, and so on.

Other processing units (also known as "logic circuits") besides the processor can be formed in first semiconductor structure 102 as well, such as one or more controllers and/or the entirety or part of the peripheral circuits of the DRAM of a second semiconductor structure 104. A controller can handle a specific operation in an embedded system. In some embodiments in which semiconductor device 100 is used in mobile devices, each controller can handle a specific operation of the mobile device, for example, communications other than cellular communication (e.g., Bluetooth communication, Wi-Fi communication, FM radio, etc.), power management, display drive, positioning and navigation, touch screen, camera, etc. First semiconductor structure 102 of semiconductor device 100 thus can further include a Bluetooth controller, a Wi-Fi controller, a FM radio controller, a power controller, a display controller, a GPS controller, a touch screen controller, a camera controller, to name a few, each of which is configured to control operations of the corresponding component in a mobile device.

In some embodiments, first semiconductor structure 102 of semiconductor device 100 further includes the entirety or part the peripheral circuits of the DRAM of second semiconductor structure 104. The peripheral circuits (also known as control and sensing circuits) can include any suitable digital, analog, and/or mixed-signal circuits used for facilitating the operations of the DRAM. For example, the peripheral circuits can include one or more of an input/output buffer, a decoder (e.g., a row decoder and a column decoder), a sense amplifier, or any active or passive components of the circuit (e.g., transistors, diodes, resistors, or capacitors).

The SRAM is integrated on the same substrate of the logic circuits (e.g., the processor and peripheral circuits), allowing wider bus and higher operation speed, which is also known as "on-die SRAM". The memory controller of the SRAM can be embedded as part of the peripheral circuits. In some embodiments, each SRAM cell includes a plurality of transistors for storing a bit of data as a positive or negative electrical charge as well as one or more transistors that control access to it. In one example, each SRAM cell has six transistors (e.g., metal-oxide-semiconductor field-effect transistors (MOSFETs)), for example, four transistors for storing a bit of data and two transistors for controlling access to the data. The SRAM cells can locate in the area that is not occupied by the logic circuits (e.g., the processor and peripheral circuits) and thus, do not need extra space to be formed. The on-die SRAM can enable high-speed operations of semiconductor device 100, used as one or more caches (e.g., instruction cache or data cache) and/or data buffers.

Semiconductor device 100 can also include second semiconductor structure 104 including an array of DRAM cells. That is, second semiconductor structure 104 can be a DRAM memory device. DRAM requires periodic refreshing of the memory cells. The memory controller for refreshing the DRAM can be embedded as another example of the controllers and peripheral circuits described above. In some embodiments, each DRAM cell includes a capacitor for storing a bit of data as a positive or negative electrical charge as well as one or more transistors that control access to it. In one example, each DRAM cell is a one-transistor, one-capacitor (1T1C) cell.

As shown in FIG. 1A, semiconductor device 100 further includes a bonding interface 106 vertically between first semiconductor structure 102 and second semiconductor structure 104. As described below in detail, first and second semiconductor structures 102 and 104 can be fabricated separately (and in parallel in some embodiments) such that the thermal budget of fabricating one of first and second semiconductor structures 102 and 104 does not limit the processes of fabricating another one of first and second semiconductor structures 102 and 104. Moreover, a large number of interconnects (e.g., bonding contacts) can be formed through bonding interface 106 to make direct, short-distance (e.g., micron-level) electrical connections between first semiconductor structure 102 and second semiconductor structure 104, as opposed to the long-distance (e.g., millimeter or centimeter-level) chip-to-chip data bus on the circuit board, such as printed circuit board (PCB), thereby eliminating chip interface delay and achieving high-speed I/O throughput with reduced power consumption. Data transfer between the DRAM in second semiconductor structure 104 and the processor in first semiconductor structure 102 as well as between the DRAM in second semiconductor structure 104 and the SRAM in first semiconductor structure 102 can be performed through the interconnects (e.g., bonding contacts) across bonding interface 106. By vertically integrating first and second semiconductor structures 102 and 104, the chip size can be reduced, and the memory cell density can be increased. Furthermore, as a "unified" chip, by integrating multiple discrete chips (e.g., various processors, controllers, and memories) into a single bonded chip (e.g., semiconductor device 100), faster system speed and smaller PCB size can be achieved as well.

Figure 1B:
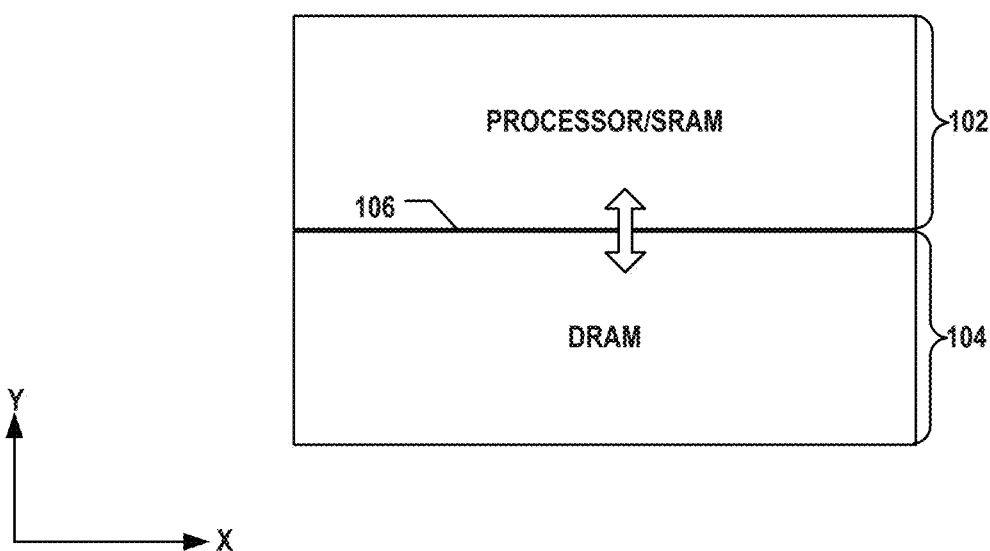
FIG. 1B illustrates a schematic view of a cross-section of another exemplary semiconductor device, according to some embodiments.

It is understood that the relative positions of stacked first and second semiconductor structures 102 and 104 are not limited. FIG. 1B illustrates a schematic view of a cross-section of another exemplary semiconductor device 101, according to some embodiments. Being different from semiconductor device 100 in FIG. 1A in which second semiconductor structure 104 including the array of DRAM cells is above first semiconductor structure 102 including the processor and the array of SRAM cells, in semiconductor device 101 in FIG. 1B, first semiconductor structure 102 including the processor and the array of SRAM cells is above second semiconductor structure 104 including the array of DRAM cells. Nevertheless, bonding interface 106 is formed vertically between first and second semiconductor structures 102 and 104 in semiconductor device 101, and first and second semiconductor structures 102 and 104 are jointed vertically through bonding (e.g., hybrid bonding) according to some embodiments. Data transfer between the DRAM in second semiconductor structure 104 and the processor in first semiconductor structure 102 as well as the data transfer between the DRAM in second semiconductor structure 104 and the SRAM in first semiconductor structure 102 can be performed through the interconnects (e.g., bonding contacts) across bonding interface 106.

Figure 2A:
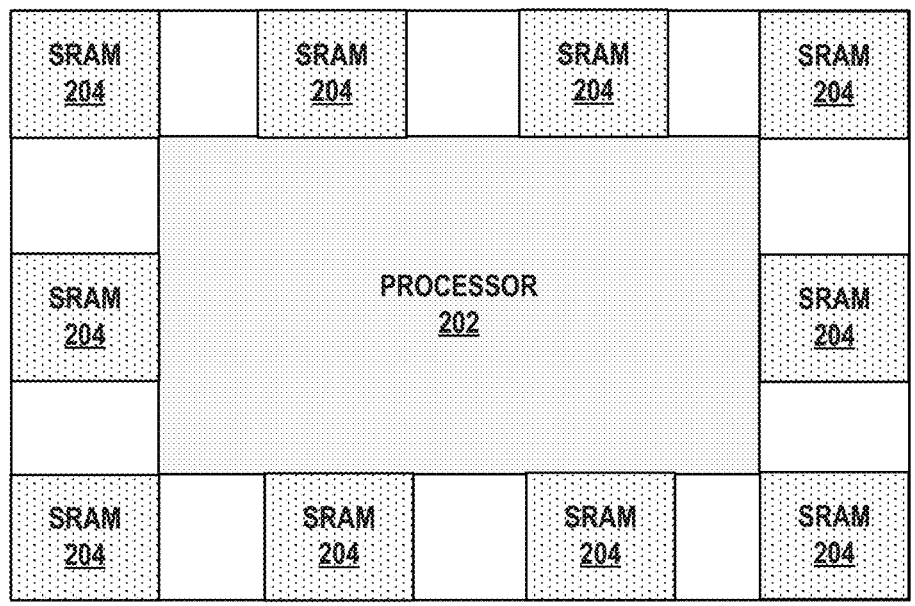
FIG. 2A illustrates a schematic plan view of an exemplary semiconductor structure having a processor and SRAM, according to some embodiments.

FIG. 2A illustrates a schematic plan view of an exemplary semiconductor structure 200 having a processor and SRAM, according to some embodiments. Semiconductor structure 200 may be one example of first semiconductor structure 102. Semiconductor structure 200 can include a processor 202 on the same substrate as SRAM 204 and fabricated using the same logic process as SRAM 204. Processor 202 can include one or more of CPUs, GPUs, DSPs, application processors, baseband processors, to name a few. SRAM 204 can be disposed outside of processor 202. For example, FIG. 2A shows an exemplary layout of SRAM 204 in which the array of SRAM cells are distributed in a plurality of separate regions in semiconductor structure 200, which is outside of processor 202. That is, the cache module formed by SRAM 204 can be divided into smaller cache regions, distributing outside of processor 202 in semiconductor structure 200. In one example, the distribution of the cache regions may be based on the design of the bonding contacts, e.g., occupying the areas without bonding contacts. In another example, the distribution of the cache regions may be random. As a result, more internal cache (e.g., using on-die SRAM) can be arranged surrounding processor 202 without occupying additional chip area.

Figure 2B:
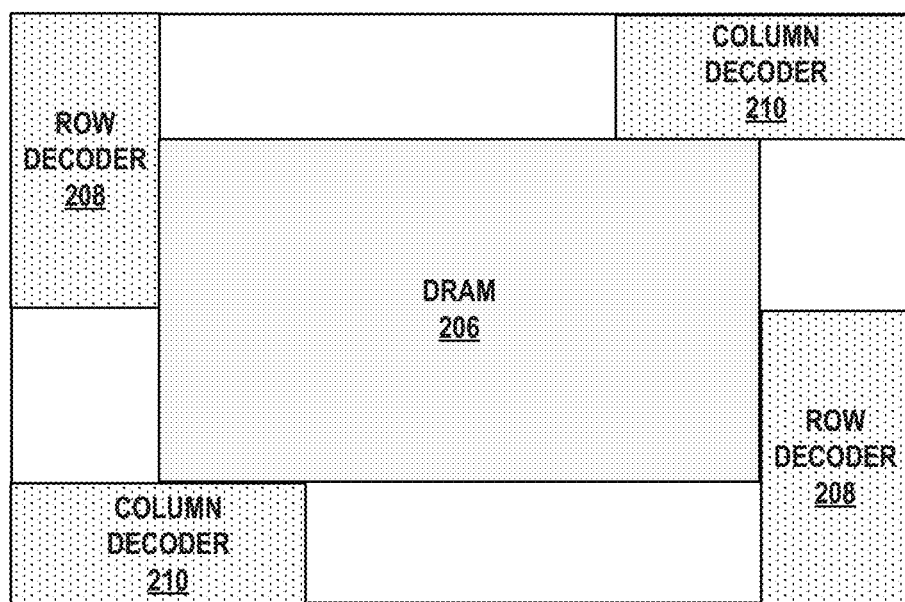
FIG. 2B illustrates a schematic plan view of an exemplary semiconductor structure having DRAM and peripheral circuits, according to some embodiments.

FIG. 2B illustrates a schematic plan view of an exemplary semiconductor structure 201 having DRAM and peripheral circuits, according to some embodiments. Semiconductor structure 201 may be one example of second semiconductor structure 104. Semiconductor structure 201 can include DRAM 206 on the same substrate as the peripheral circuits of DRAM 206. Semiconductor structure 201 can include all the peripheral circuits for controlling and sensing DRAM 206, including, for example, row decoders 208, column decoders 210, and any other suitable devices. FIG. 2B shows an exemplary layout of the peripheral circuit (e.g., row decoders 208, column decoders 210) and DRAM 206 in which the peripheral circuit (e.g., row decoders 208, column decoders 210) and DRAM 206 are formed in different regions on the same plane. For example, the peripheral circuit (e.g., row decoders 208, column decoders 210) may be formed outside of DRAM 206.

It is understood that the layouts of semiconductor structures 200 and 201 are not limited to the exemplary layouts in FIGS. 2A and 2B. In some embodiments, part of the peripheral circuits of DRAM 206 (e.g., one or more of row decoders 208, column decoders 210, and any other suitable devices) may be in semiconductor structure 201 having processor 202 and SRAM 204. That is, the peripheral circuits of DRAM 206 may be distributed on both semiconductor structures 200 and 201, according to some other embodiments. In some embodiments, at least some of the peripheral circuits (e.g., row decoders 208, column decoders 210) and DRAM 206 (e.g., the array of DRAM cells) are stacked one over another, i.e., in different planes. For example, DRAM 206 (e.g., the array of DRAM cells) may be formed above or below the peripheral circuits to further reduce the chip size. Similarly, in some embodiments, at least part of SRAM 204 (e.g., the array of SRAM cells) and processor 202 are stacked one over another, i.e., in different planes. For example, SRAM 204 (e.g., the array of SRAM cells) may be formed above or below processor 202 to further reduce the chip size.

Figure 3A:
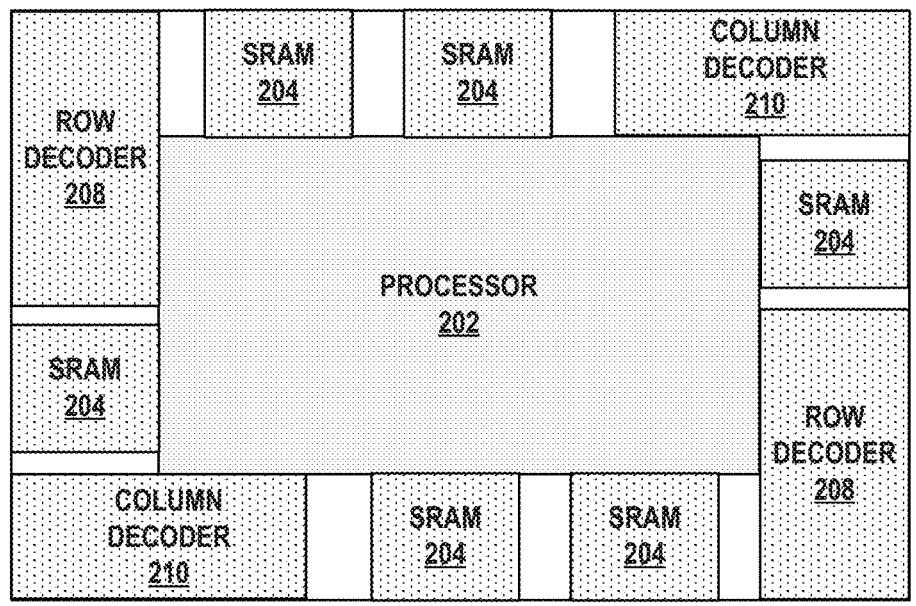
FIG. 3A illustrates a schematic plan view of an exemplary semiconductor structure having a processor, SRAM, and peripheral circuits, according to some embodiments.

FIG. 3A illustrates a schematic plan view of an exemplary semiconductor structure 300 having a processor, SRAM, and peripheral circuits, according to some embodiments. Semiconductor structure 300 may be one example of first semiconductor structure 102. Semiconductor structure 300 can include processor 202 on the same substrate as SRAM 204 and the peripheral circuits (e.g., row decoders 208, column decoders 210) and fabricated using the same logic process as SRAM 204 and the peripheral circuits. Processor 202 can include one or more of CPUs, GPUs, DSPs, application processors, baseband processors, to name a few. Both SRAM 204 and the peripheral circuits (e.g., row decoders 208, column decoders 210) can be disposed outside of processor 202. For example, FIG. 3A shows an exemplary layout of SRAM 204 in which the array of SRAM cells are distributed in a plurality of separate regions in semiconductor structure 300, which is outside of processor 202. Semiconductor structure 300 can include all the peripheral circuits for controlling and sensing DRAM 206, including, for example, row decoders 208, column decoders 210, and any other suitable devices. FIG. 3A shows an exemplary layout of the peripheral circuits (e.g., row decoders 208, column decoders 210) in which the peripheral circuits (e.g., row decoders 208, column decoders 210) and SRAM 204 are formed in different regions on the same plane outside of processor 202. It is understood that in some embodiments, at least some of the peripheral circuits (e.g., row decoders 208, column decoders 210), SRAM 204 (e.g., the array of SRAM cells), and processor 202 are stacked one over another, i.e., in different planes. For example, SRAM 204 (e.g., the array of SRAM cells) may be formed above or below the peripheral circuits to further reduce the chip size.

Figure 3B:
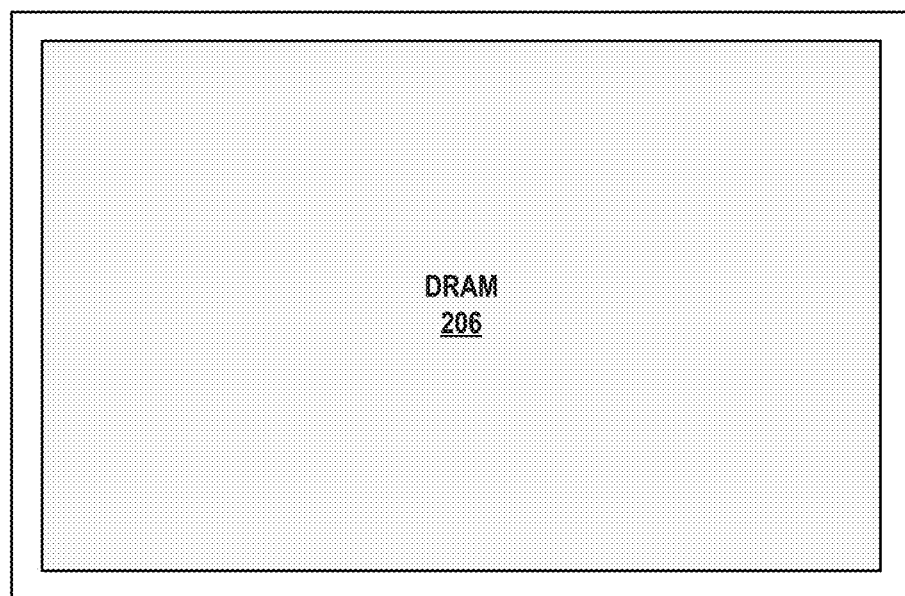
FIG. 3B illustrates a schematic plan view of an exemplary semiconductor structure having DRAM, according to some embodiments.

FIG. 3B illustrates a schematic plan view of an exemplary semiconductor structure 301 having DRAM, according to some embodiments. Semiconductor structure 301 may be one example of second semiconductor structure 104. By moving all the peripheral circuits (e.g., row decoders 208, column decoders 210) away from semiconductor structure 301 (e.g., to semiconductor structure 300), the size of DRAM 206 (e.g., the number of DRAM cells) in semiconductor structure 301 can be increased.

Figure 4A:
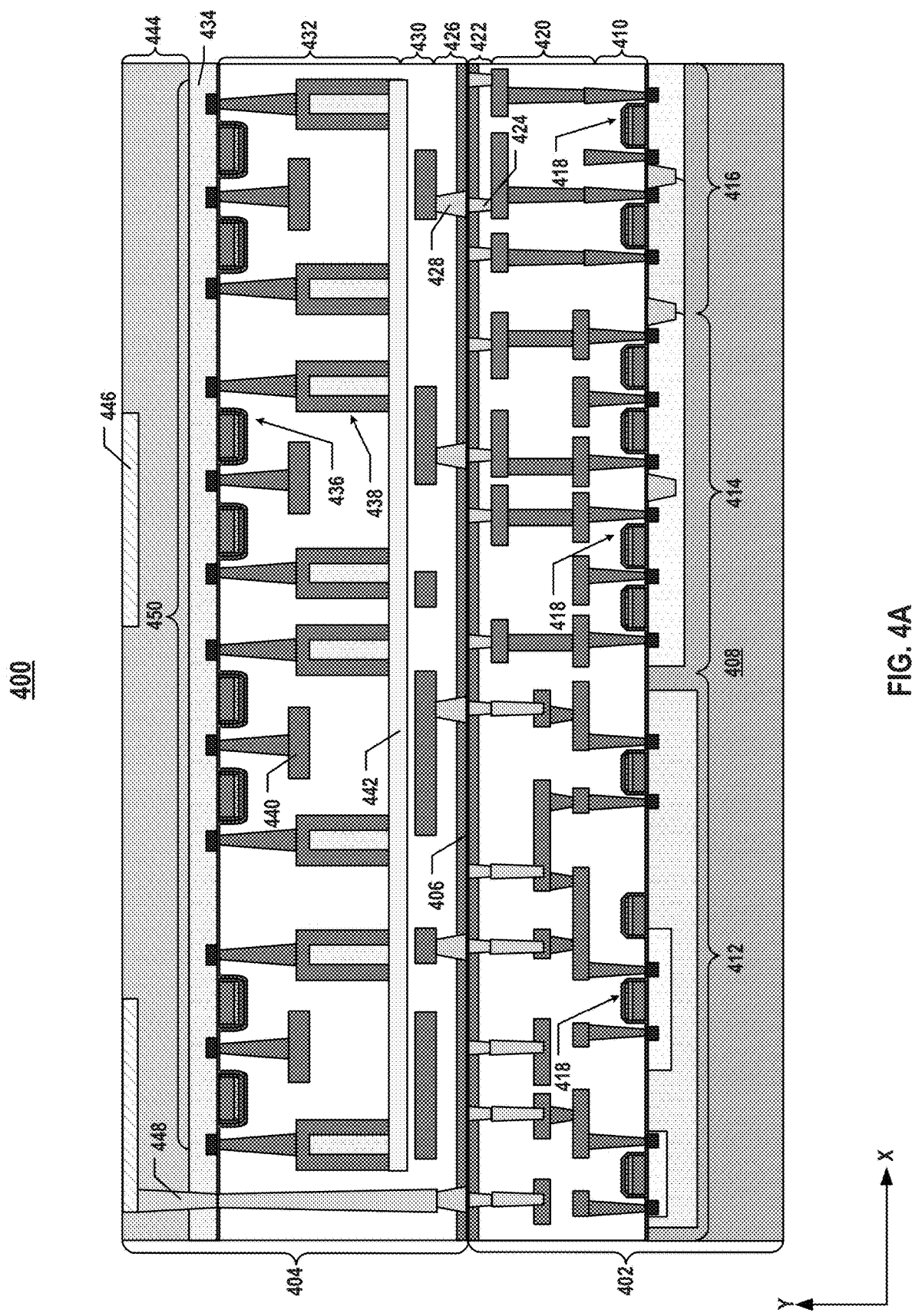
FIG. 4A illustrates a cross-section of an exemplary semiconductor device, according to some embodiments.

FIG. 4A illustrates a cross-section of an exemplary semiconductor device 400, according to some embodiments. As one example of semiconductor device 100 described above with respect to FIG. 1A, semiconductor device 400 is a bonded chip including a first semiconductor structure 402 and a second semiconductor structure 404 stacked over first semiconductor structure 402. First and second semiconductor structures 402 and 404 are jointed at a bonding interface 406 therebetween, according to some embodiments. As shown in FIG. 4A, first semiconductor structure 402 can include a substrate 408, which can include silicon (e.g., single crystalline silicon, c-Si), silicon germanium (SiGe), gallium arsenide (GaAs), germanium (Ge), silicon on insulator (SOI), or any other suitable materials.

First semiconductor structure 402 of semiconductor device 400 can include a device layer 410 above substrate 408. It is noted that x- and y-axes are added in FIG. 4A to further illustrate the spatial relationship of the components in semiconductor device 400. Substrate 408 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., semiconductor device 400) is determined relative to the substrate of the semiconductor device (e.g., substrate 408) in the y-direction (the vertical direction or thickness direction) when the substrate is positioned in the lowest plane of the semiconductor device in the y-direction. The same notion for describing the spatial relationship is applied throughout the present disclosure.

In some embodiments, device layer 410 includes a processor 412 on substrate 408 and an array of SRAM cells 414 on substrate 408 and outside of processor 412. In some embodiments, device layer 410 further includes a peripheral circuit 416 on substrate 408 and outside of processor 412. For example, peripheral circuit 416 may be part or the entirety of the peripheral circuits for controlling and sensing the DRAM of semiconductor device 400 as described below in detail. In some embodiments, processor 412 includes a plurality of transistors 418 forming any suitable specialized processors and/or SoCs as described above in detail. In some embodiments, transistors 418 also form array of SRAM cells 414 used as, for example, cache and/or data buffer of semiconductor device 400. For example, array of SRAM cells 414 may function as the internal instruction cache and/or data cache of processor 412. Array of SRAM cells 414 can be distributed in a plurality of separate regions in first semiconductor structure 402. In some embodiments, transistors 418 further form peripheral circuit 416, i.e., any suitable digital, analog, and/or mixed-signal control and sensing circuits used for facilitating the operation of the DRAM including, but not limited to, an input/output buffer, a decoder (e.g., a row decoder and a column decoder), and a sense amplifier.

Transistors 418 can be formed "on" substrate 408, in which the entirety or part of transistors 418 are formed in substrate 408 (e.g., below the top surface of substrate 408) and/or directly on substrate 408. Isolation regions (e.g., shallow trench isolations (STIs)) and doped regions (e.g., source regions and drain regions of transistors 418) can be formed in substrate 408 as well. Transistors 418 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.), according to some embodiments.

In some embodiments, first semiconductor structure 402 of semiconductor device 400 further includes an interconnect layer 420 above device layer 410 to transfer electrical signals to and from processor 412 and array of SRAM cells 414 (and peripheral circuit 416 if any). Interconnect layer 420 can include a plurality of interconnects (also referred to herein as "contacts"), including lateral interconnect lines and vertical interconnect access (via) contacts. As used herein, the term "interconnects" can broadly include any suitable types of interconnects, such as middle-end-of-line (MEOL) interconnects and back-end-of-line (BEOL) interconnects. Interconnect layer 420 can further include one or more interlayer dielectric (ILD) layers (also known as "intermetal dielectric (IMD) layers") in which the interconnect lines and via contacts can form. That is, interconnect layer 420 can include interconnect lines and via contacts in multiple ILD layers. The interconnect lines and via contacts in interconnect layer 420 can include conductive materials including, but not limited to, tungsten (W), cobalt (Co), copper (Cu), aluminum (Al), silicides, or any combination thereof. The ILD layers in interconnect layer 420 can include dielectric materials including, but not limited to, silicon oxide, silicon nitride, silicon oxynitride, low dielectric constant (low-k) dielectrics, or any combination thereof. In some embodiments, the devices in device layer 410 are electrically connected to one another through the interconnects in interconnect layer 420. For example, array of SRAM cells 414 may be electrically connected to processor 412 through interconnect layer 420.

As shown in FIG. 4A, first semiconductor structure 402 of semiconductor device 400 can further include a bonding layer 422 at bonding interface 406 and above interconnect layer 420 and device layer 410 (including processor 412 and array of SRAM cells 414). Bonding layer 422 can include a plurality of bonding contacts 424 and dielectrics electrically isolating bonding contacts 424. Bonding contacts 424 can include conductive materials including, but not limited to, W, Co, Cu, Al, silicides, or any combination thereof. The remaining area of bonding layer 422 can be formed with dielectrics including, but not limited to, silicon oxide, silicon nitride, silicon oxynitride, low-k dielectrics, or any combination thereof. Bonding contacts 424 and surrounding dielectrics in bonding layer 422 can be used for hybrid bonding.

Similarly, as shown in FIG. 4A, second semiconductor structure 404 of semiconductor device 400 can also include a bonding layer 426 at bonding interface 406 and above bonding layer 422 of first semiconductor structure 402. Bonding layer 426 can include a plurality of bonding contacts 428 and dielectrics electrically isolating bonding contacts 428. Bonding contacts 428 can include conductive materials including, but not limited to, W, Co, Cu, Al, silicides, or any combination thereof. The remaining area of bonding layer 426 can be formed with dielectrics including, but not limited to, silicon oxide, silicon nitride, silicon oxynitride, low-k dielectrics, or any combination thereof. Bonding contacts 428 and surrounding dielectrics in bonding layer 426 can be used for hybrid bonding. Bonding contacts 428 are in contact with bonding contacts 424 at bonding interface 406, according to some embodiments.

As described above, second semiconductor structure 404 can be bonded on top of first semiconductor structure 402 in a face-to-face manner at bonding interface 406. In some embodiments, bonding interface 406 is disposed between bonding layers 422 and 426 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, bonding interface 406 is the place at which bonding layers 422 and 426 are met and bonded. In practice, bonding interface 406 can be a layer with a certain thickness that includes the top surface of bonding layer 422 of first semiconductor structure 402 and the bottom surface of bonding layer 426 of second semiconductor structure 404.

In some embodiments, second semiconductor structure 404 of semiconductor device 400 further includes an interconnect layer 430 above bonding layer 426 to transfer electrical signals. Interconnect layer 430 can include a plurality of interconnects, such as MEOL interconnects and BEOL interconnects. In some embodiments, the interconnects in interconnect layer 430 also include local interconnects, such as bit line contacts and word line contacts. Interconnect layer 430 can further include one or more ILD layers in which the interconnect lines and via contacts can form. The interconnect lines and via contacts in interconnect layer 430 can include conductive materials including, but not limited to, W, Co, Cu, Al, silicides, or any combination thereof. The ILD layers in interconnect layer 430 can include dielectric materials including, but not limited to, silicon oxide, silicon nitride, silicon oxynitride, low-k dielectrics, or any combination thereof.

Second semiconductor structure 404 of semiconductor device 400 can further include a device layer 432 above interconnect layer 430 and bonding layer 426. In some embodiments, device layer 432 includes an array of DRAM cells 450 above interconnect layer 430 and bonding layer 426. In some embodiments, each DRAM cell 450 includes a DRAM selection transistor 436 and a capacitor 438. DRAM cell 450 can be a 1T1C cell consisting of one transistor and one capacitor. It is understood that DRAM cell 450 may be of any suitable configurations, such as 2T1C cell, 3T1C cell, etc. In some embodiments, DRAM selection transistors 436 are formed "on" a semiconductor layer 434, in which the entirety or part of DRAM selection transistors 436 are formed in semiconductor layer 434 (e.g., below the top surface of semiconductor layer 434) and/or directly on semiconductor layer 434. Isolation regions (e.g., STIs) and doped regions (e.g., source regions and drain regions of DRAM selection transistors 436) can be formed in semiconductor layer 434 as well. In some embodiments, capacitors 438 are disposed below DRAM selection transistors 436. Each capacitor 438 includes two electrodes, one of which is electrically connected to one node of respective DRAM selection transistor 436, according to some embodiments. Another node of each DRAM selection transistor 436 is electrically connected to a bit line 440 of DRAM, according to some embodiments. Another electrode of each capacitor 438 can be electrically connected to a common plate 442, e.g., a common ground. It is understood that the structure and configuration of DRAM cell 450 are not limited to the example in FIG. 4A and may include any suitable structure and configuration. For example, capacitor 438 may be a planar capacitor, a stack capacitor, a multi-fins capacitor, a cylinder capacitor, a trench capacitor, or a substrate-plate capacitor.

In some embodiments, second semiconductor structure 404 further includes semiconductor layer 434 disposed above device layer 432. Semiconductor layer 434 can be above and in contact with array of DRAM cells 450. Semiconductor layer 434 can be a thinned substrate on which DRAM selection transistors 436 are formed. In some embodiments, semiconductor layer 434 includes single-crystal silicon. In some embodiments, semiconductor layer 434 can include polysilicon, amorphous silicon, SiGe, GaAs, Ge, or any other suitable materials. Semiconductor layer 434 can also include isolation regions and doped regions (e.g., as the sources and drains of DRAM selection transistors 436).

As shown in FIG. 4A, second semiconductor structure 404 of semiconductor device 400 can further include a pad-out interconnect layer 444 above semiconductor layer 434. Pad-out interconnect layer 444 can include interconnects, e.g., contact pads 446, in one or more ILD layers. Pad-out interconnect layer 444 and interconnect layer 430 can be formed at opposite sides of semiconductor layer 434. In some embodiments, the interconnects in pad-out interconnect layer 444 can transfer electrical signals between semiconductor device 400 and outside circuits, e.g., for pad-out purposes.

In some embodiments, second semiconductor structure 404 further includes one or more contacts 448 extending through semiconductor layer 434 to electrically connect pad-out interconnect layer 444 and interconnect layers 430 and 420. As a result, processor 412 and array of SRAM cells 414 (and peripheral circuit 416 if any) can be electrically connected to array of DRAM cells 450 through interconnect layers 430 and 420 as well as bonding contacts 428 and 424. Moreover, processor 412, array of SRAM cells 414, and array of DRAM cells 450 can be electrically connected to outside circuits through contacts 448 and pad-out interconnect layer 444.

Figure 4B:
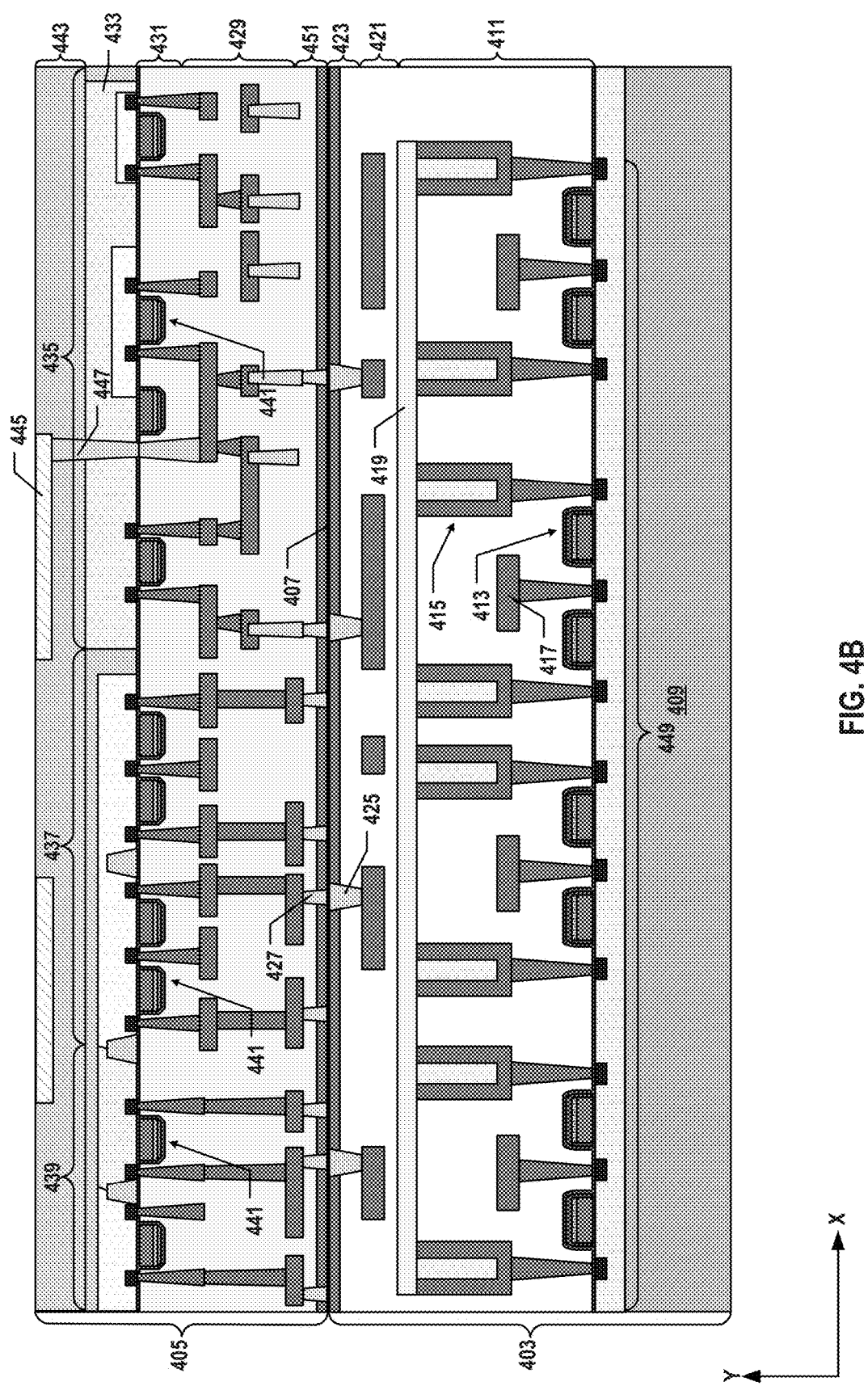
FIG. 4B illustrates a cross-section of another exemplary semiconductor device, according to some embodiments.

FIG. 4B illustrates a cross-section of another exemplary semiconductor device 401, according to some embodiments. As one example of semiconductor device 101 described above with respect to FIG. 1B, semiconductor device 401 is a bonded chip including a second semiconductor structure 403 and a first semiconductor structure 405 stacked over second semiconductor structure 403. Similar to semiconductor device 400 described above in FIG. 4A, semiconductor device 401 represents an example of a bonded chip in which first semiconductor structure 405 including a processor and SRAM and second semiconductor structure 403 including DRAM are formed separately and bonded in a face-to-face manner at a bonding interface 407. Different from semiconductor device 400 described above in FIG. 4A in which first semiconductor structure 402 including the processor and SRAM is below second semiconductor structure 404 including the DRAM, semiconductor device 401 in FIG. 4B includes first semiconductor structure 405 including the processor and SRAM disposed above second semiconductor structure 403 including the DRAM. It is understood that the details of similar structures (e.g., materials, fabrication process, functions, etc.) in both semiconductor devices 400 and 401 may not be repeated below.

Second semiconductor structure 403 of semiconductor device 401 can include a substrate 409 and a device layer 411 above substrate 409. Device layer 411 can include an array of DRAM cells 449 on substrate 409. In some embodiments, each DRAM cell 449 includes a DRAM selection transistor 413 and a capacitor 415. DRAM cell 449 can be a 1T1C cell consisting of one transistor and one capacitor. It is understood that DRAM cell 449 may be of any suitable configuration, such as 2T1C cell, 3T1C cell, etc. In some embodiments, DRAM selection transistors 413 are formed "on" substrate 409, in which the entirety or part of DRAM selection transistors 413 are formed in substrate 409 and/or directly on substrate 409. In some embodiments, capacitors 415 are disposed above DRAM selection transistors 413. Each capacitor 415 includes two electrodes, one of which is electrically connected to one node of respective DRAM selection transistor 413, according to some embodiments. Another node of each DRAM selection transistor 413 is electrically connected to a bit line 417 of DRAM, according to some embodiments. Another electrode of each capacitor 415 can be electrically connected to a common plate 419, e.g., a common ground. It is understood that the structure and configuration of DRAM cell 449 are not limited to the example in FIG. 4B and may include any suitable structure and configuration.

In some embodiments, second semiconductor structure 403 of semiconductor device 401 also includes an interconnect layer 421 above device layer 411 to transfer electrical signals to and from array of DRAM cells 449. Interconnect layer 421 can include a plurality of interconnects, including interconnect lines and via contacts. In some embodiments, the interconnects in interconnect layer 421 also include local interconnects, such as bit line contacts and word line contacts. In some embodiments, second semiconductor structure 403 of semiconductor device 401 further includes a bonding layer 423 at bonding interface 407 and above interconnect layer 421 and device layer 411. Bonding layer 423 can include a plurality of bonding contacts 425 and dielectrics surrounding and electrically isolating bonding contacts 425.

As shown in FIG. 4B, first semiconductor structure 405 of semiconductor device 401 includes another bonding layer 451 at bonding interface 407 and above bonding layer 423. Bonding layer 451 can include a plurality of bonding contacts 427 and dielectrics surrounding and electrically isolating bonding contacts 427. Bonding contacts 427 are in contact with bonding contacts 425 at bonding interface 407, according to some embodiments. In some embodiments, first semiconductor structure 405 of semiconductor device 401 also includes an interconnect layer 429 above bonding layer 451 to transfer electrical signals. Interconnect layer 429 can include a plurality of interconnects, including interconnect lines and via contacts.

First semiconductor structure 405 of semiconductor device 401 can further include a device layer 431 above interconnect layer 429 and bonding layer 451. In some embodiments, device layer 431 includes a processor 435 above interconnect layer 429 and bonding layer 451, and an array of SRAM cells 437 above interconnect layer 429 and bonding layer 451 and outside of processor 435. In some embodiments, device layer 431 further includes a peripheral circuit 439 above interconnect layer 429 and bonding layer 451 and outside of processor 435. For example, peripheral circuit 439 may be part or the entirety of the peripheral circuits for controlling and sensing array of DRAM cells 449. In some embodiments, the devices in device layer 431 are electrically connected to one another through the interconnects in interconnect layer 429. For example, array of SRAM cells 437 may be electrically connected to processor 435 through interconnect layer 429.

In some embodiments, processor 435 includes a plurality of transistors 441 forming any suitable specialized processors and/or SoCs. Transistors 441 can be formed "on" a semiconductor layer 433, in which the entirety or part of transistors 441 are formed in semiconductor layer 433 and/or directly on semiconductor layer 433. Isolation regions (e.g., STIs) and doped regions (e.g., source regions and drain regions of transistors 441) can be formed in semiconductor layer 433 as well. Transistors 441 can form array of SRAM cells 437 (and peripheral circuit 439 if any). Transistors 441 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.), according to some embodiments.

In some embodiments, first semiconductor structure 405 further includes semiconductor layer 433 disposed above device layer 431. Semiconductor layer 433 can be above and in contact with processor 435 and array of SRAM cells 437. Semiconductor layer 433 can be a thinned substrate on which transistors 441 are formed. In some embodiments, semiconductor layer 433 includes single-crystal silicon. In some embodiments, semiconductor layer 433 can include polysilicon, amorphous silicon, SiGe, GaAs, Ge, or any other suitable materials. Semiconductor layer 433 can also include isolation regions and doped regions.

As shown in FIG. 4B, first semiconductor structure 405 of semiconductor device 401 can further include a pad-out interconnect layer 443 above semiconductor layer 433. Pad-out interconnect layer 443 can include interconnects, e.g., contact pads 445, in one or more ILD layers. In some embodiments, the interconnects in pad-out interconnect layer 443 can transfer electrical signals between semiconductor device 401 and outside circuits, e.g., for pad-out purposes. In some embodiments, first semiconductor structure 405 further includes one or more contacts 447 extending through semiconductor layer 433 to electrically connect pad-out interconnect layer 443 and interconnect layers 429 and 421. As a result, processor 435 and array of SRAM cells 437 (and peripheral circuit 439 if any) can also be electrically connected to array of DRAM cells 449 through interconnect layers 429 and 421 as well as bonding contacts 427 and 425. Moreover, processor 435, array of SRAM cells 437, and array of DRAM cells 449 can be electrically connected to outside circuits through contacts 447 and pad-out interconnect layer 443.

Figure 5A:
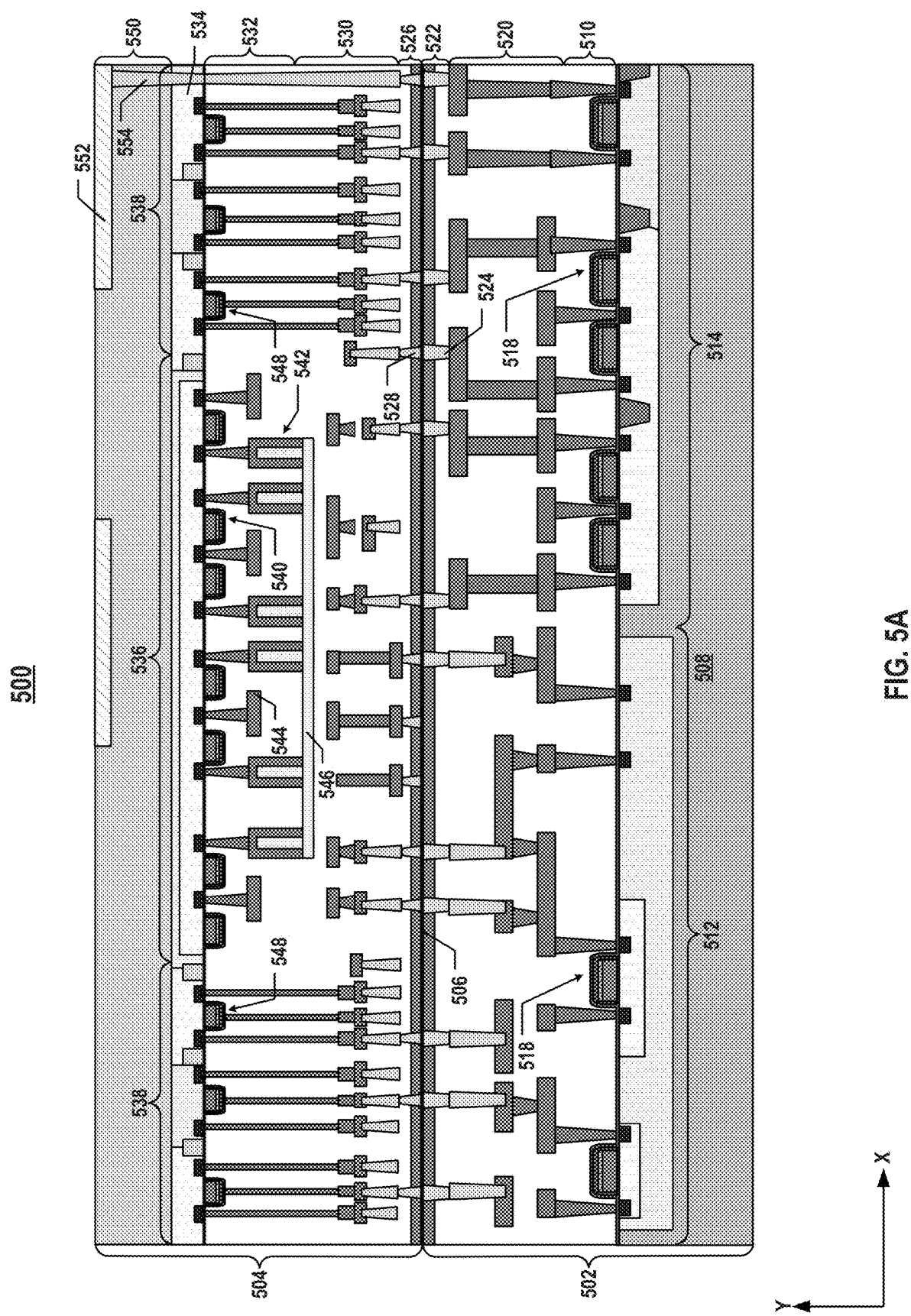
FIG. 5A illustrates a cross-section of still another exemplary semiconductor device, according to some embodiments.

FIG. 5A illustrates a cross-section of still another exemplary semiconductor device 500, according to some embodiments. Similar to semiconductor device 400 described above in FIG. 4A, semiconductor device 500 represents an example of a bonded chip including a first semiconductor structure 502 having a processor 512 and an array of SRAM cells 514, and a second semiconductor structure 504 having an array of DRAM cells 536 above first semiconductor structure 502. Different from semiconductor device 400 described above in FIG. 4A in which peripheral circuit 416 is in first semiconductor structure 402, but not in second semiconductor structure 404, peripheral circuits 538 are formed in second semiconductor structure 504 in which array of DRAM cells 536 are formed. Similar to semiconductor device 400 described above in FIG. 4A, first and second semiconductor structures 502 and 504 of semiconductor device 500 are bonded in a face-to-face manner at a bonding interface 506, as shown in FIG. 5A. It is understood that the details of similar structures (e.g., materials, fabrication process, functions, etc.) in both semiconductor devices 400 and 500 may not be repeated below.

First semiconductor structure 502 of semiconductor device 500 can include a device layer 510 above a substrate 508. In some embodiments, device layer 510 includes processor 512 on substrate 508, and array of SRAM cells 514 on substrate 508 and outside of processor 512. In some embodiments, processor 512 includes a plurality of transistors 518 forming any suitable specialized processors and/or SoCs as described above in detail. In some embodiments, transistors 518 also form array of SRAM cells 514 used as, for example, cache and/or data buffer of semiconductor device 500.

In some embodiments, first semiconductor structure 502 of semiconductor device 500 also includes an interconnect layer 520 above device layer 510 to transfer electrical signals to and from processor 512 and array of SRAM cells 514. Interconnect layer 520 can include a plurality of interconnects, including interconnect lines and via contacts. In some embodiments, first semiconductor structure 502 of semiconductor device 500 further includes a bonding layer 522 at bonding interface 506 and above interconnect layer 520 and device layer 510 (including processor 512 and array of SRAM cells 514). Bonding layer 522 can include a plurality of bonding contacts 524 and dielectrics surrounding and electrically isolating bonding contacts 524.

Similarly, as shown in FIG. 5A, second semiconductor structure 504 of semiconductor device 500 can also include a bonding layer 526 at bonding interface 506 and above bonding layer 522 of first semiconductor structure 502. Bonding layer 526 can include a plurality of bonding contacts 528 and dielectrics electrically isolating bonding contacts 528. Bonding contacts 528 are in contact with bonding contacts 524 at bonding interface 506, according to some embodiments. In some embodiments, second semiconductor structure 504 of semiconductor device 500 also includes an interconnect layer 530 above bonding layer 526 to transfer electrical signals. Interconnect layer 530 can include a plurality of interconnects, including interconnect lines and via contacts.

Second semiconductor structure 504 of semiconductor device 500 can further include a device layer 532 above interconnect layer 530 and bonding layer 526. In some embodiments, device layer 532 includes array of DRAM cells 536 above interconnect layer 530 and bonding layer 526. In some embodiments, each DRAM cell 536 includes a DRAM selection transistor 540 and a capacitor 542. DRAM cell 536 can be a 1T1C cell consisting of one transistor and one capacitor. It is understood that DRAM cell 536 may be of any suitable configurations, such as 2T1C cell, 3T1C cell, etc. In some embodiments, DRAM selection transistors 540 are formed "on" a semiconductor layer 534, in which the entirety or part of DRAM selection transistors 540 are formed in semiconductor layer 534 (e.g., below the top surface of semiconductor layer 534) and/or directly on semiconductor layer 534. Isolation regions (e.g., STIs) and doped regions (e.g., source regions and drain regions of DRAM selection transistors 540) can be formed in semiconductor layer 534 as well. In some embodiments, capacitors 542 are disposed below DRAM selection transistors 540. Each capacitor 542 includes two electrodes, one of which is electrically connected to one node of respective DRAM selection transistor 540, according to some embodiments. Another node of each DRAM selection transistor 540 is electrically connected to a bit line 544 of DRAM, according to some embodiments. Another electrode of each capacitor 542 can be electrically connected to a common plate 546, e.g., a common ground. It is understood that the structure and configuration of DRAM cell 536 are not limited to the example in FIG. 5A and may include any suitable structure and configuration.

In some embodiments, device layer 532 further includes peripheral circuits 538 above interconnect layer 530 and bonding layer 526 and outside of array of DRAM cells 536. For example, peripheral circuits 538 may be part or the entirety of the peripheral circuits for controlling and sensing array of DRAM cells 536. In some embodiments, peripheral circuits 538 include a plurality of transistors 548 forming any suitable digital, analog, and/or mixed-signal control and sensing circuits used for facilitating the operation of array of DRAM cells 536 including, but not limited to, an input/output buffer, a decoder (e.g., a row decoder and a column decoder), and a sense amplifier. Peripheral circuits 538 and array of DRAM cells 536 can be electrically connected through the interconnects of interconnect layer 530.

In some embodiments, second semiconductor structure 504 further includes semiconductor layer 534 disposed above device layer 532. Semiconductor layer 534 can be above and in contact with array of DRAM cells 536. Semiconductor layer 534 can be a thinned substrate on which transistors 548 and DRAM selection transistors 540 are formed. In some embodiments, semiconductor layer 534 includes single-crystal silicon. In some embodiments, semiconductor layer 534 can include polysilicon, amorphous silicon, SiGe, GaAs, Ge, or any other suitable materials. Semiconductor layer 534 can also include isolation regions and doped regions.

As shown in FIG. 5A, second semiconductor structure 504 of semiconductor device 500 can further include a pad-out interconnect layer 550 above semiconductor layer 534. Pad-out interconnect layer 550 includes interconnects, e.g., contact pads 552, in one or more ILD layers. In some embodiments, the interconnects in pad-out interconnect layer 550 can transfer electrical signals between semiconductor device 500 and outside circuits, e.g., for pad-out purposes. In some embodiments, second semiconductor structure 504 further includes one or more contacts 554 extending through semiconductor layer 534 to electrically connect pad-out interconnect layer 550 and interconnect layers 530 and 520. As a result, processor 512 and array of SRAM cells 514 can be electrically connected to array of DRAM cells 536 through interconnect layers 530 and 520 as well as bonding contacts 528 and 524. Moreover, processor 512, array of SRAM cells 514, and array of DRAM cells 536 can be electrically connected to outside circuits through contacts 554 and pad-out interconnect layer 550.

Figure 5B:
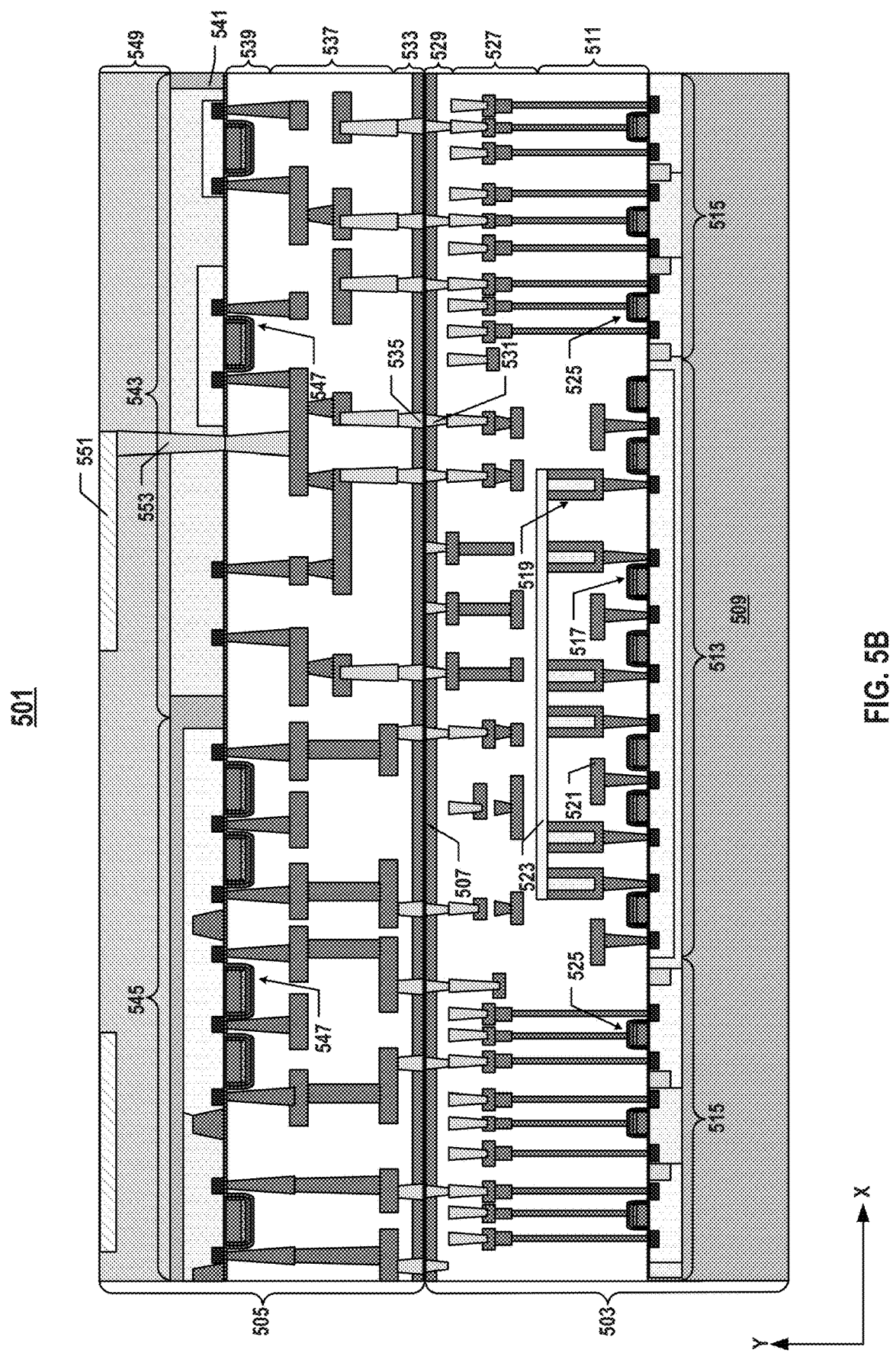
FIG. 5B illustrates a cross-section of yet another exemplary semiconductor device, according to some embodiments.

FIG. 5B illustrates a cross-section of yet another exemplary semiconductor device 501, according to some embodiments. As one example of semiconductor device 101 described above with respect to FIG. 1B, semiconductor device 501 is a bonded chip including a second semiconductor structure 503 and a first semiconductor structure 505 stacked over second semiconductor structure 503. Similar to semiconductor device 500 described above in FIG. 5A, semiconductor device 501 represents an example of a bonded chip in which first semiconductor structure 505 including a processor and SRAM and second semiconductor structure 503 including peripheral circuits and DRAM are formed separately and bonded in a face-to-face manner at a bonding interface 507. Different from semiconductor device 500 described above in FIG. 5A in which first semiconductor structure 502 including the processor and SRAM is below second semiconductor structure 504 including the peripheral circuits and DRAM, semiconductor device 501 in FIG. 5B includes first semiconductor structure 505 including the processor and SRAM disposed above second semiconductor structure 503 including the peripheral circuits and DRAM. It is understood that the details of similar structures (e.g., materials, fabrication process, functions, etc.) in both semiconductor devices 500 and 501 may not be repeated below.

Second semiconductor structure 503 of semiconductor device 501 can include a substrate 509 and a device layer 511 above substrate 509. Device layer 511 can include an array of DRAM cells 513 on substrate 509. In some embodiments, each DRAM cell 513 includes a DRAM selection transistor 517 and a capacitor 519. DRAM cell 513 can be a 1T1C cell consisting of one transistor and one capacitor. It is understood that DRAM cell 513 may be of any suitable configuration, such as 2T1C cell, 3T1C cell, etc. In some embodiments, DRAM selection transistors 517 are formed "on" substrate 509, in which the entirety or part of DRAM selection transistors 517 are formed in substrate 509 and/or directly on substrate 509. In some embodiments, capacitors 519 are disposed above DRAM selection transistors 517. Each capacitor 519 includes two electrodes, one of which is electrically connected to one node of respective DRAM selection transistor 517, according to some embodiments. Another node of each DRAM selection transistor 517 is electrically connected to a bit line 521 of DRAM, according to some embodiments. Another electrode of each capacitor 519 can be electrically connected to a common plate 523, e.g., a common ground. It is understood that the structure and configuration of DRAM cell 513 are not limited to the example in FIG. 5B and may include any suitable structure and configuration.

In some embodiments, device layer 511 further includes peripheral circuits 515 on substrate 509 and outside of array of DRAM cells 513. For example, peripheral circuits 515 may be part or the entirety of the peripheral circuits for controlling and sensing array of DRAM cells 513. In some embodiments, peripheral circuits 515 include a plurality of transistors 525 forming any suitable digital, analog, and/or mixed-signal control and sensing circuits used for facilitating the operation of array of DRAM cells 513 including, but not limited to, an input/output buffer, a decoder (e.g., a row decoder and a column decoder), and a sense amplifier.

In some embodiments, second semiconductor structure 503 of semiconductor device 501 also includes an interconnect layer 527 above device layer 511 to transfer electrical signals to and from array of DRAM cells 513. Interconnect layer 527 can include a plurality of interconnects, including interconnect lines and via contacts. In some embodiments, the interconnects in interconnect layer 527 also include local interconnects, such as bit line contacts and word line contacts. Peripheral circuits 515 and array of DRAM cells 513 can be electrically connected through the interconnects of interconnect layer 527. In some embodiments, second semiconductor structure 503 of semiconductor device 501 further includes a bonding layer 529 at bonding interface 507 and above interconnect layer 527 and device layer 511. Bonding layer 529 can include a plurality of bonding contacts 531 and dielectrics surrounding and electrically isolating bonding contacts 531.

As shown in FIG. 5B, first semiconductor structure 505 of semiconductor device 501 includes another bonding layer 533 at bonding interface 507 and above bonding layer 529. Bonding layer 533 can include a plurality of bonding contacts 535 and dielectrics surrounding and electrically isolating bonding contacts 535. Bonding contacts 535 are in contact with bonding contacts 531 at bonding interface 507, according to some embodiments. In some embodiments, first semiconductor structure 505 of semiconductor device 501 also includes an interconnect layer 537 above bonding layer 533 to transfer electrical signals. Interconnect layer 537 can include a plurality of interconnects, including interconnect lines and via contacts.

First semiconductor structure 505 of semiconductor device 501 can further include a device layer 539 above interconnect layer 537 and bonding layer 533. In some embodiments, device layer 539 includes a processor 543 above interconnect layer 537 and bonding layer 533, and an array of SRAM cells 545 above interconnect layer 537 and bonding layer 533 and outside of processor 543. In some embodiments, the devices in device layer 539 are electrically connected to one another through the interconnects in interconnect layer 537. For example, array of SRAM cells 545 may be electrically connected to processor 543 through interconnect layer 537.

In some embodiments, processor 543 includes a plurality of transistors 547 forming any suitable specialized processors and/or SoCs. Transistors 547 can be formed "on" a semiconductor layer 541, in which the entirety or part of transistors 547 are formed in semiconductor layer 541 and/or directly on semiconductor layer 541. Isolation regions (e.g., STIs) and doped regions (e.g., source regions and drain regions of transistors 547) can be formed in semiconductor layer 541 as well. Transistors 547 can also form array of SRAM cells 545. Transistors 547 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.), according to some embodiments.

In some embodiments, first semiconductor structure 505 further includes semiconductor layer 541 disposed above device layer 539. Semiconductor layer 541 can be above and in contact with processor 543 and array of SRAM cells 545. Semiconductor layer 541 can be a thinned substrate on which transistors 547 are formed. In some embodiments, semiconductor layer 541 includes single-crystal silicon. In some embodiments, semiconductor layer 541 can include polysilicon, amorphous silicon, SiGe, GaAs, Ge, or any other suitable materials. Semiconductor layer 541 can also include isolation regions and doped regions.

As shown in FIG. 5B, first semiconductor structure 505 of semiconductor device 501 can further include a pad-out interconnect layer 549 above semiconductor layer 541. Pad-out interconnect layer 549 includes interconnects, e.g., contact pads 551, in one or more ILD layers. In some embodiments, the interconnects in pad-out interconnect layer 549 can transfer electrical signals between semiconductor device 501 and outside circuits, e.g., for pad-out purposes. In some embodiments, first semiconductor structure 505 further includes one or more contacts 553 extending through semiconductor layer 541 to electrically connect pad-out interconnect layer 549 and interconnect layers 537 and 527. As a result, processor 543 and array of SRAM cells 545 can be electrically connected to array of DRAM cells 513 through interconnect layers 537 and 527 as well as bonding contacts 535 and 531. Moreover, processor 543, array of SRAM cells 545, and array of DRAM cells 513 can be electrically connected to outside circuits through contacts 553 and pad-out interconnect layer 549.

Figure 6A:
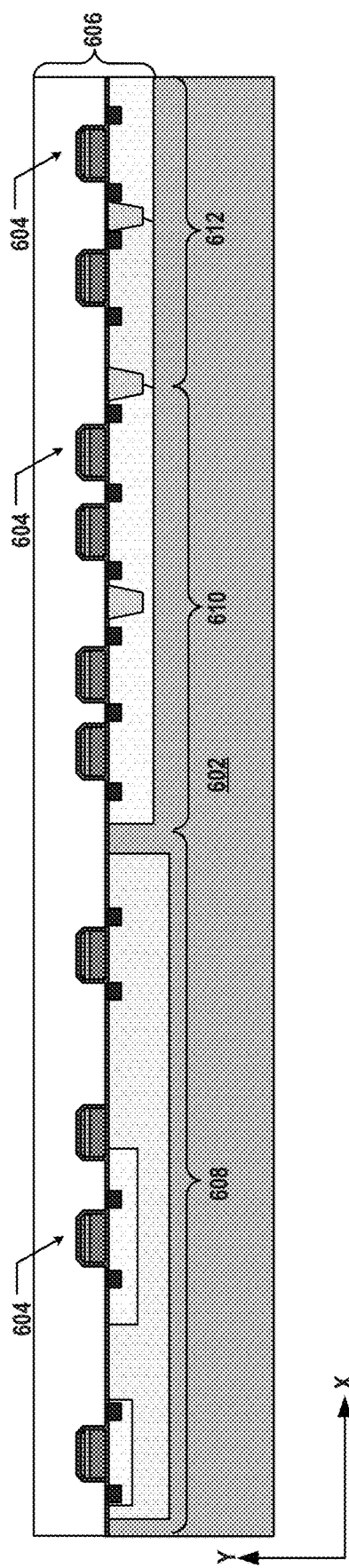
FIGS. 6A and 6B illustrate a fabrication process for forming an exemplary semiconductor structure having a processor, SRAM, and peripheral circuits, according to some embodiments.
Figure 6B:
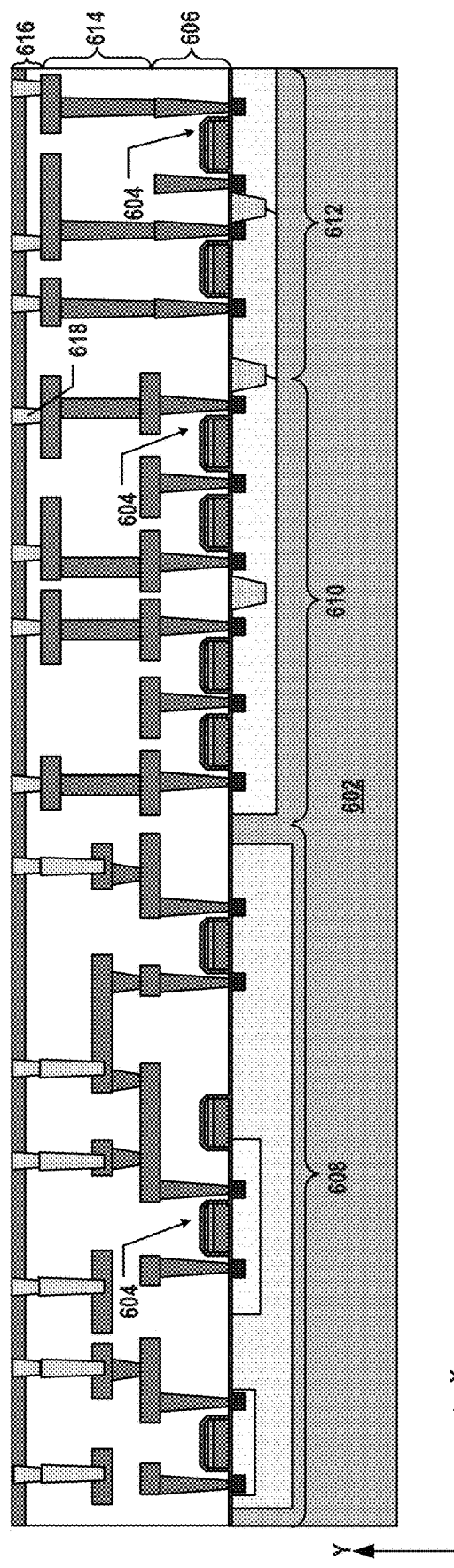
Figure 7A:
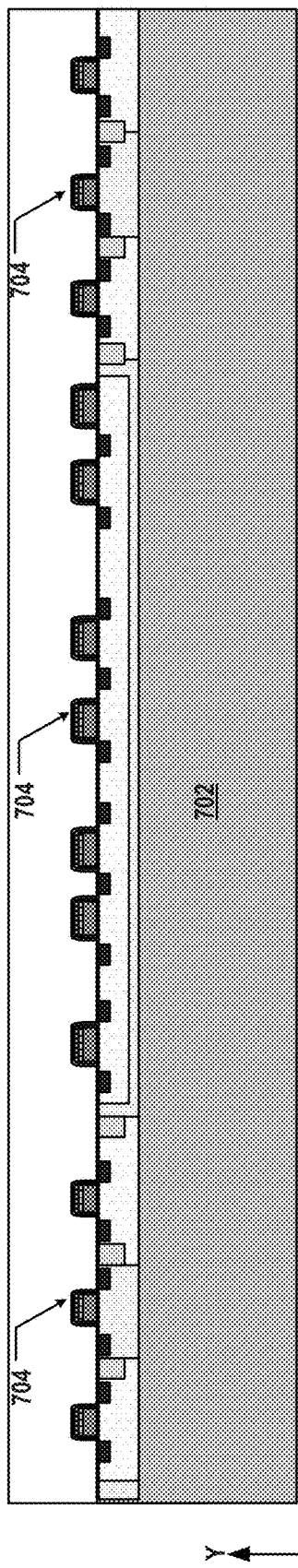
FIGS. 7A-7C illustrate a fabrication process for forming an exemplary semiconductor structure having DRAM and peripheral circuits, according to some embodiments.
Figure 7B:
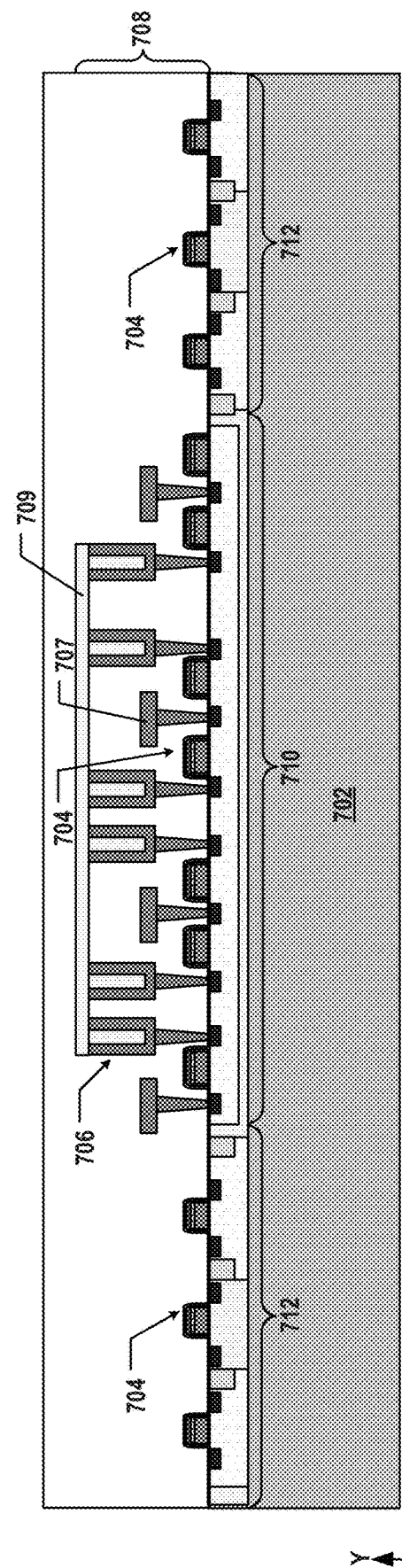
Figure 7C:
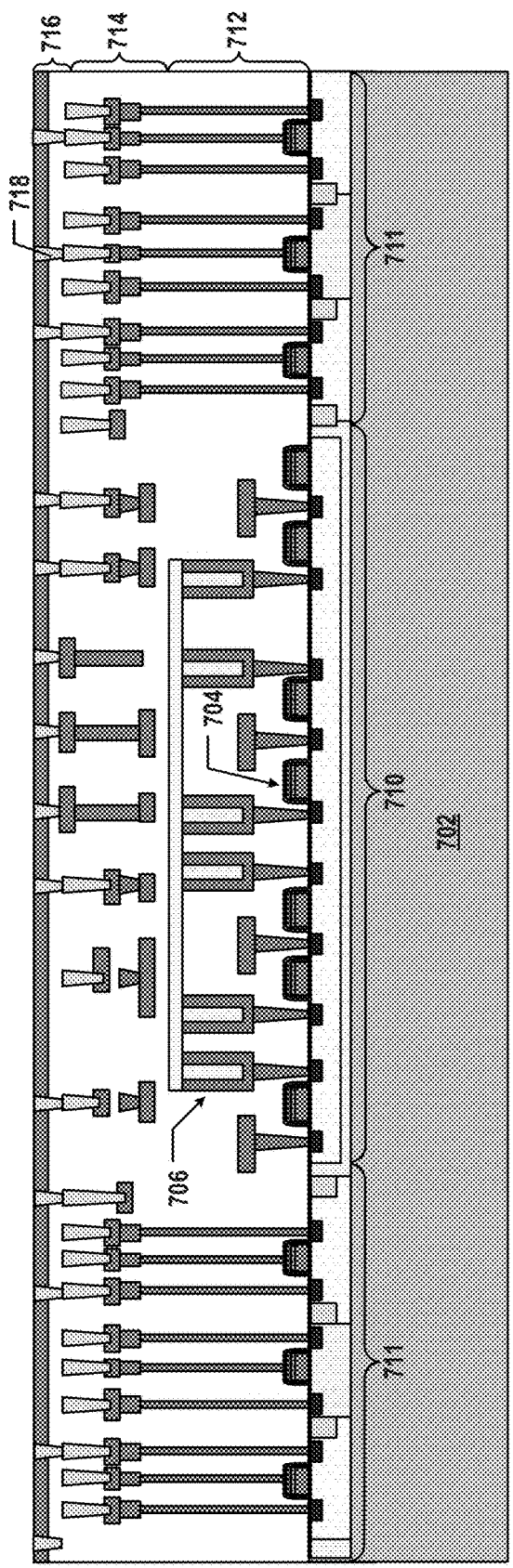
Figure 8A:
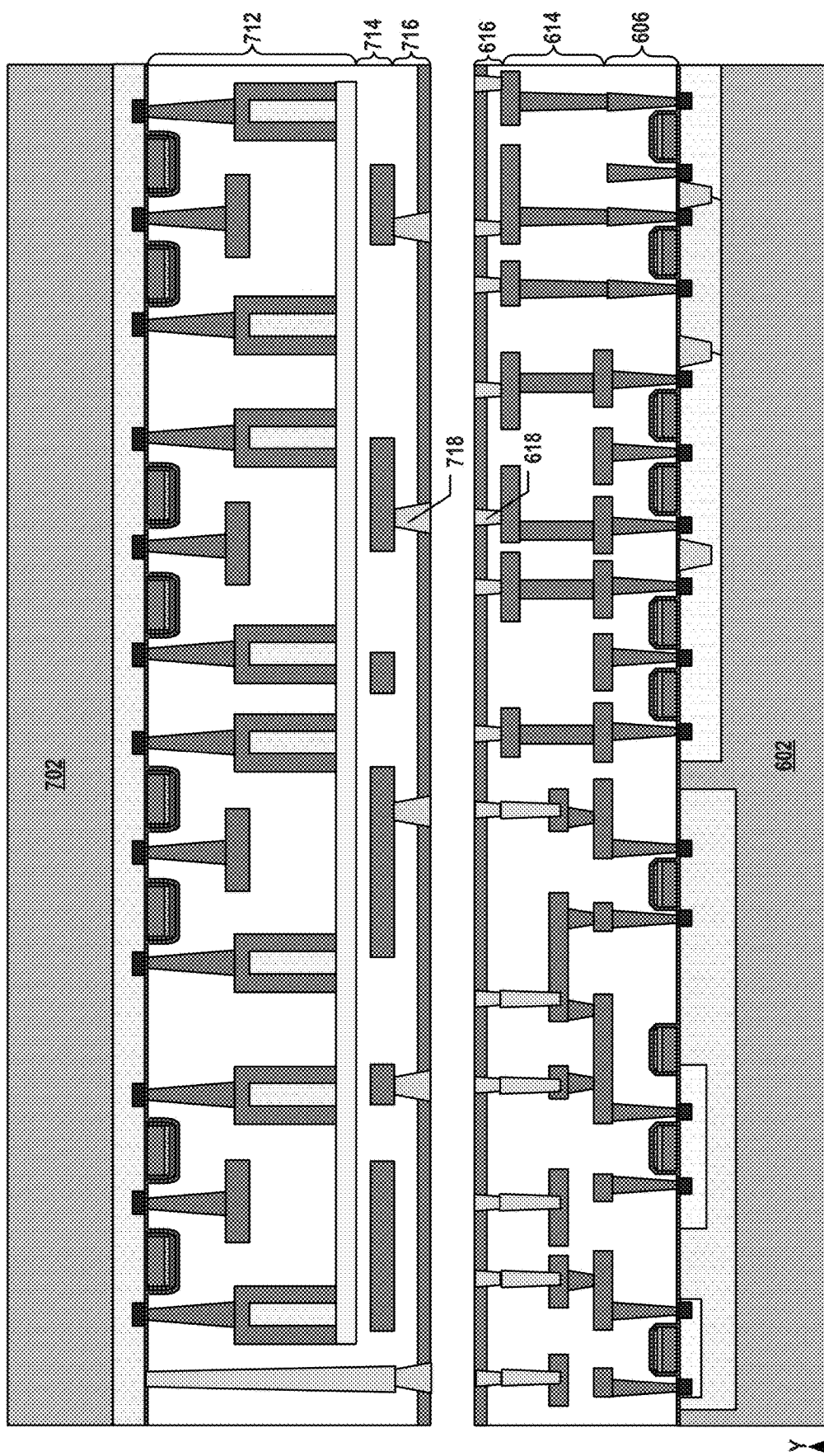
FIGS. 8A and 8B illustrate a fabrication process for forming an exemplary semiconductor device, according to some embodiments.
Figure 8B:
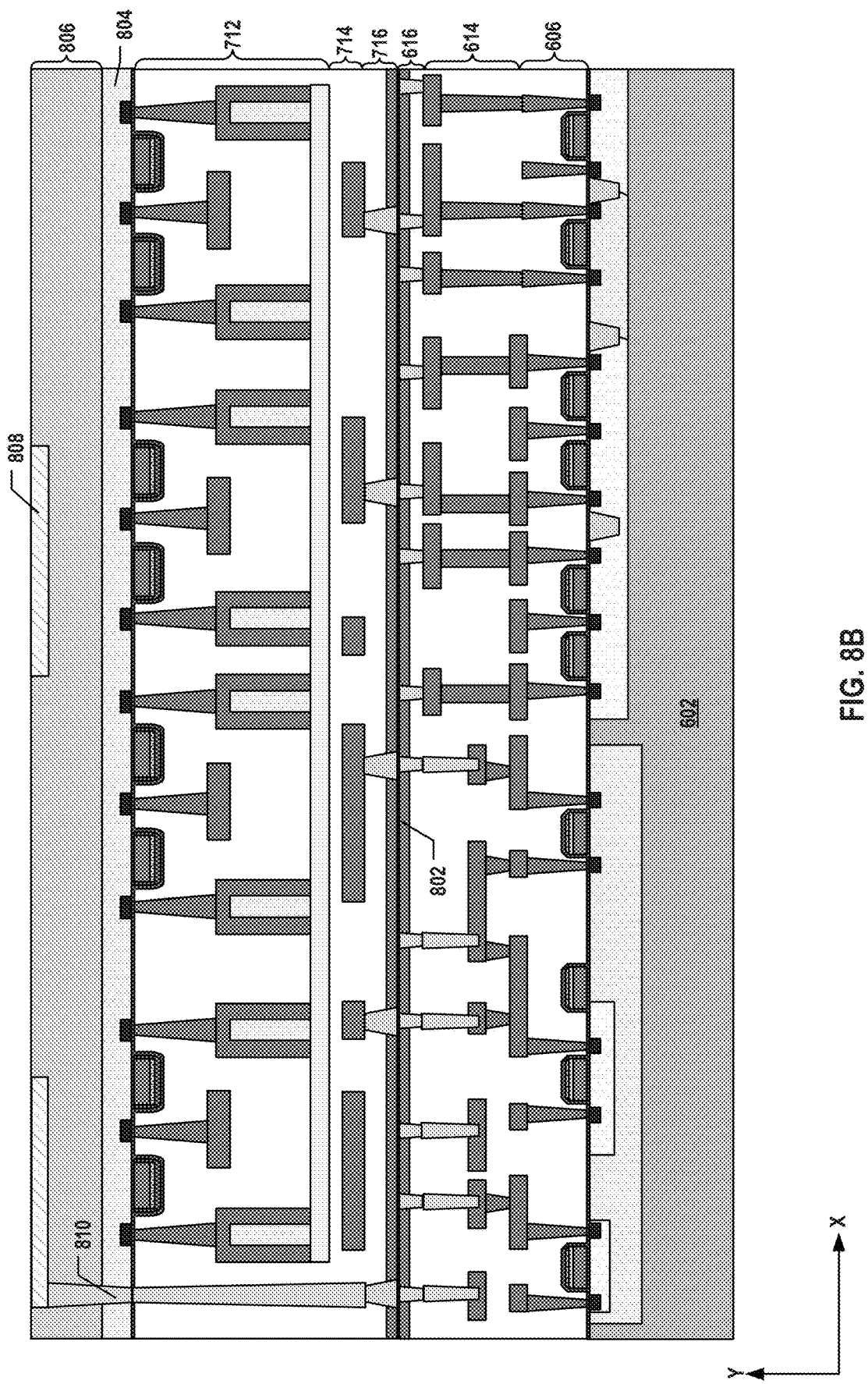
Figure 9A:
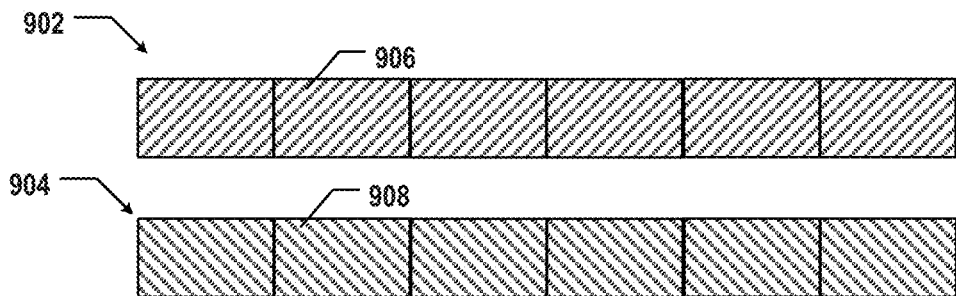
FIGS. 9A-9C illustrate a fabrication process for bonding and dicing an exemplary semiconductor structure, according to some embodiments.
Figure 9B:
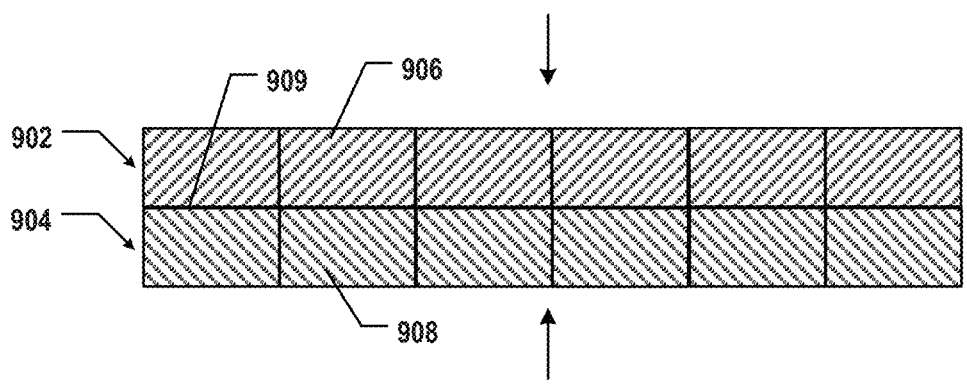
Figure 9C:
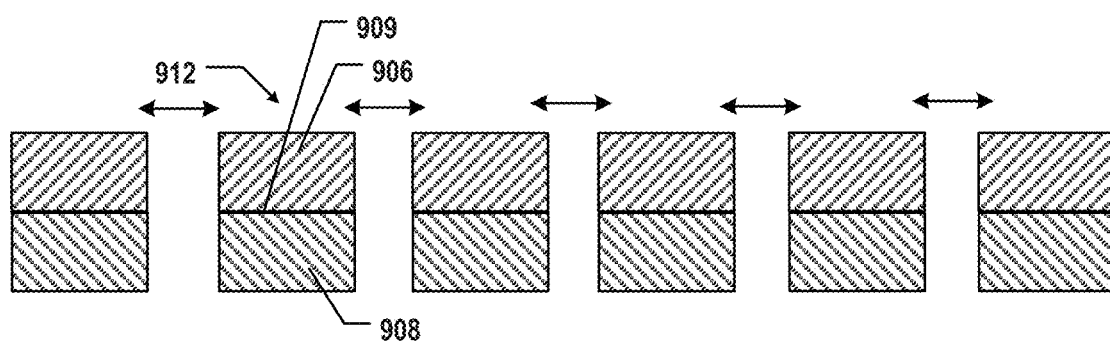
Figure 10A:
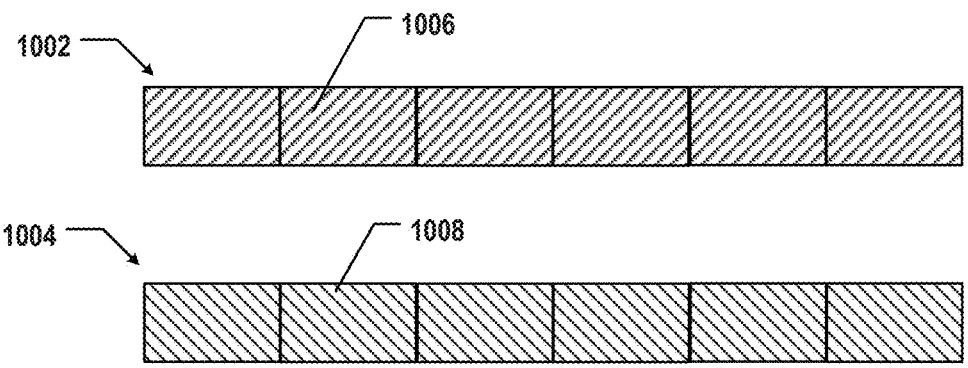
FIGS. 10A-10C illustrate a fabrication process for dicing and bonding an exemplary semiconductor structure, according to some embodiments.
Figure 10B:
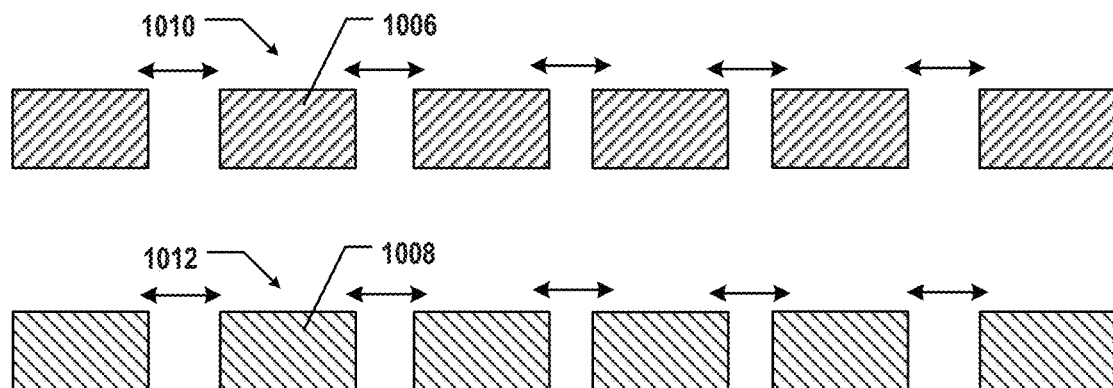
Figure 10C:
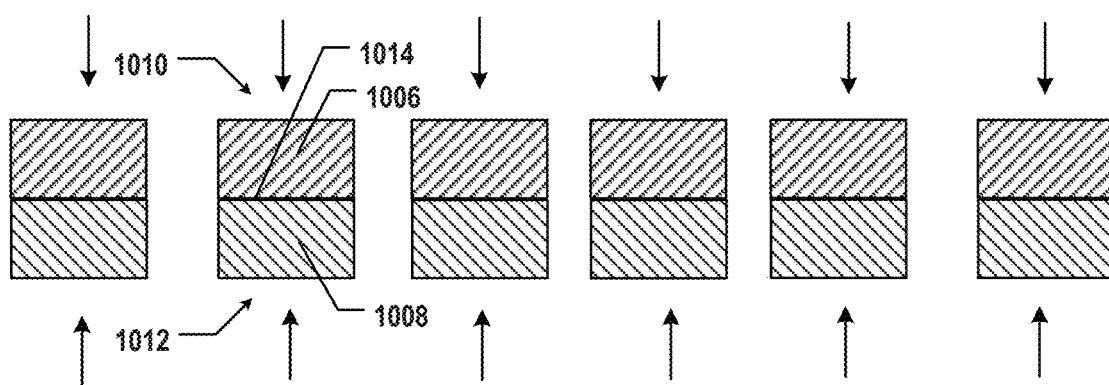
Figure 11:
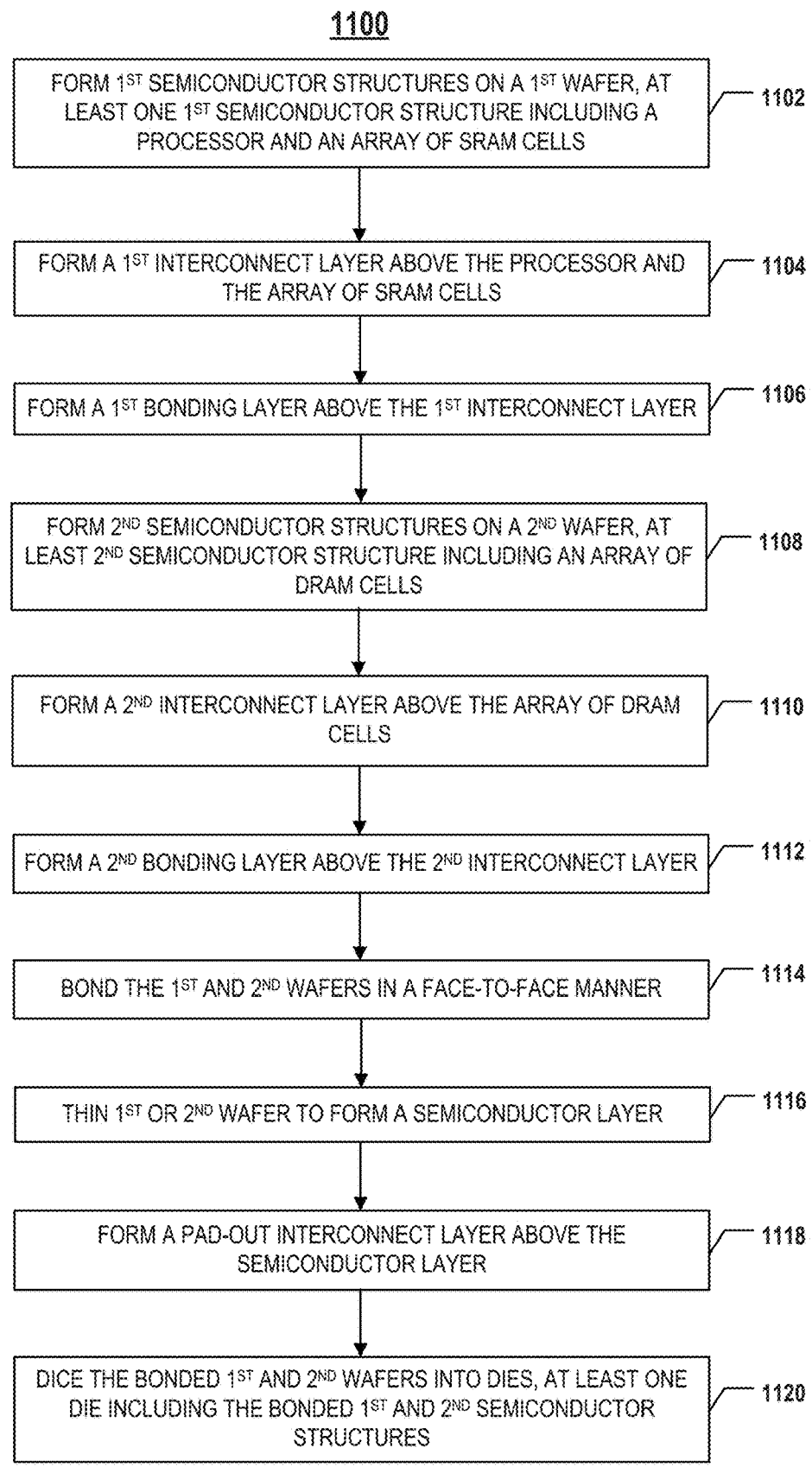
FIG. 11 is a flowchart of an exemplary method for forming a semiconductor device, according to some embodiments.
Figure 12:
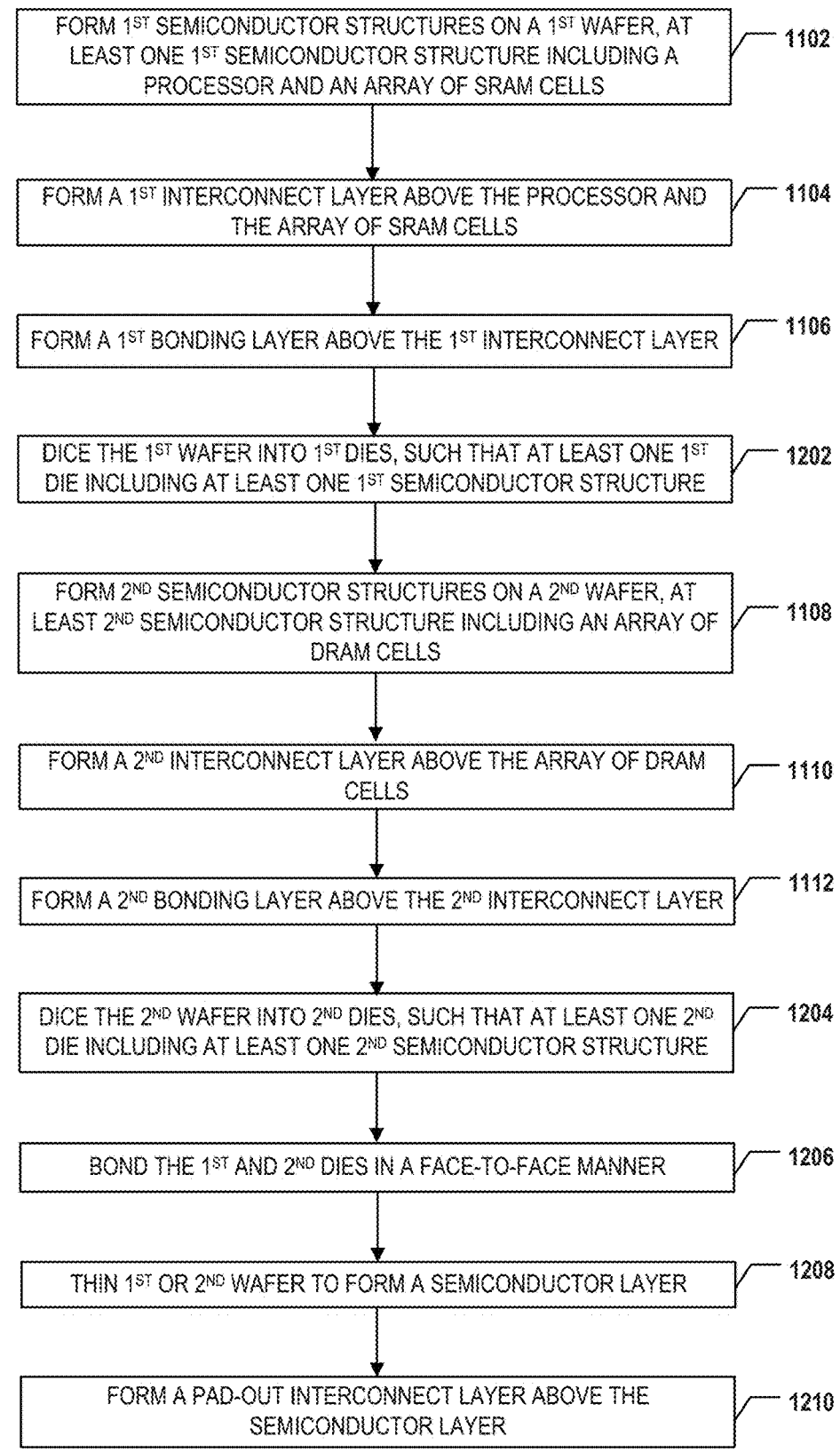
FIG. 12 is a flowchart of another exemplary method for forming a semiconductor device, according to some embodiments.

FIGS. 6A and 6B illustrate a fabrication process for forming an exemplary semiconductor structure having a processor, SRAM, and peripheral circuits, according to some embodiments. FIGS. 7A-7C illustrate a fabrication process for forming an exemplary semiconductor structure having DRAM and peripheral circuits, according to some embodiments. FIGS. 8A and 8B illustrate a fabrication process for forming an exemplary semiconductor device, according to some embodiments. FIGS. 9A-9C illustrate a fabrication process for bonding and dicing an exemplary semiconductor structure, according to some embodiments. FIGS. 10A-10C illustrate a fabrication process for dicing and bonding an exemplary semiconductor structure, according to some embodiments. FIG. 11 is a flowchart of an exemplary method 1100 for forming a semiconductor device, according to some embodiments. FIG. 12 is a flowchart of another exemplary method 1200 for forming a semiconductor device, according to some embodiments. Examples of the semiconductor device depicted in FIGS. 6A, 6B, 7A-7C, 8A, 8B, 9A-9C, 10A-10C, 11, and 12 include semiconductor devices 400, 401, 500, 501 depicted in FIGS. 4A, 4B, 5A, and 5B, respectively. FIGS. 6A, 6B, 7A-7C, 8A, 8B, 9A-9C, 10A-10C, 11, and 12 will be described together. It is understood that the operations shown in methods 1100 and 1200 are not exhaustive and that other operations can be performed as well before, after, or between any of the illustrated operations. Further, some of the operations may be performed simultaneously, or in a different order than shown in FIGS. 11 and 12.

As depicted in FIGS. 6A and 6B, a first semiconductor structure including a processor, an array of SRAM cells, a peripheral circuit, and a first bonding layer including a plurality of first bonding contacts is formed. As depicted in FIGS. 7A-7C, a second semiconductor structure including an array of DRAM cells, peripheral circuits, and a second bonding layer including a plurality of second bonding contacts is formed. As depicted in FIGS. 8A and 8B, the first semiconductor structure and the second semiconductor structure are bonded in a face-to-face manner, such that the first bonding contacts are in contact with the second bonding contacts at a bonding interface.

Referring to FIG. 11, method 1100 starts at operation 1102, in which a plurality of first semiconductor structures are formed on a first wafer. At least one of the first semiconductor structures includes a processor, an array of SRAM cells, and a first bonding layer including a plurality of first bonding contacts. The first wafer can be a silicon wafer. In some embodiments, to form the plurality of first semiconductor structures, the processor and the array of SRAM cells are formed on the first wafer. In some embodiments, to form the processor and the array of SRAM cells, a plurality of transistors are formed on the first wafer. In some embodiments, to form the plurality of first semiconductor structures, a peripheral circuit of the array of DRAM cells is also formed on the first wafer.

As illustrated in FIG. 9A, a plurality of first semiconductor structures 906 are formed on a first wafer 902. First wafer 902 can include a plurality of shots separated by scribing lines. Each shot of first wafer 902 includes one or more first semiconductor structures 906, according to some embodiments. FIGS. 6A and 6B illustrate one example of the formation of first semiconductor structure 906.

As illustrated in FIG. 6A, a plurality of transistors 604 are formed on a silicon substrate 602 (as part of first wafer 902, e.g., a silicon wafer). Transistors 604 can be formed by a plurality of processes including, but not limited to, photolithography, dry/wet etch, thin film deposition, thermal growth, implantation, chemical mechanical polishing (CMP), and any other suitable processes. In some embodiments, doped regions are formed in silicon substrate 602 by ion implantation and/or thermal diffusion, which function, for example, as source regions and/or drain regions of transistors 604. In some embodiments, isolation regions (e.g., STIs) are also formed in silicon substrate 602 by wet/dry etch and thin film deposition. Transistors 604 can form a device layer 606 on silicon substrate 602. In some embodiments, device layer 606 includes a processor 608, an array of SRAM cells 610, and a peripheral circuit 612.

Method 1100 proceeds to operation 1104, as illustrated in FIG. 11, in which a first interconnect layer is formed above the processor and the array of SRAM cells. The first interconnect layer can include a first plurality of interconnects in one or more ILD layers. As illustrated in FIG. 6B, an interconnect layer 614 can be formed above device layer 606 including processor 608 and array of SRAM cells 610. Interconnect layer 614 can include interconnects of MEOL and/or BEOL in a plurality of ILD layers to make electrical connections with device layer 606. In some embodiments, interconnect layer 614 includes multiple ILD layers and interconnects therein formed in multiple processes. For example, the interconnects in interconnect layers 614 can include conductive materials deposited by one or more thin film deposition processes including, but not limited to, chemical vapor deposition (CVD), physical vapor deposition (PVD), atomic layer deposition (ALD), electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 6B can be collectively referred to as interconnect layer 614.

Method 1100 proceeds to operation 1106, as illustrated in FIG. 11, in which a first bonding layer is formed above the first interconnect layer. The first bonding layer can include a plurality of first bonding contacts. As illustrated in FIG. 6B, a bonding layer 616 is formed above interconnect layer 614. Bonding layer 616 can include a plurality of bonding contacts 618 surrounded by dielectrics. In some embodiments, a dielectric layer is deposited on the top surface of interconnect layer 614 by one or more thin film deposition processes including, but not limited to, CVD, PVD, ALD, or any combination thereof. Bonding contacts 618 then can be formed through the dielectric layer and in contact with the interconnects in interconnect layer 614 by first patterning contact holes through the dielectric layer using patterning process (e.g., photolithography and dry/wet etch of dielectric materials in the dielectric layer). The contact holes can be filled with a conductor (e.g., copper). In some embodiments, filling the contact holes includes depositing a barrier layer, an adhesion layer, and/or a seed layer before depositing the conductor.

Method 1100 proceeds to operation 1108, as illustrated in FIG. 11, in which a plurality of second semiconductor structures are formed on a second wafer. At least one of the second semiconductor structures includes an array of DRAM cells and a second bonding layer including a plurality of second bonding contacts. The second wafer can be a silicon wafer. In some embodiments, to form the plurality of second semiconductor structures, the array of DRAM cells are formed on the second wafer. In some embodiments, to form the array of DRAM cells, a plurality of transistors are formed on the second wafer, and a plurality of capacitors are formed above and in contact with at least some of the transistors. In some embodiments, to form the plurality of second semiconductor structures, a peripheral circuit of the array of DRAM cells is also formed on the second wafer.

As illustrated in FIG. 9A, a plurality of second semiconductor structures 908 are formed on a second wafer 904. Second wafer 904 can include a plurality of shots separated by scribing lines. Each shot of second wafer 904 includes one or more second semiconductor structures 908, according to some embodiments. FIGS. 7A-7C illustrate one example of the formation of second semiconductor structure 908.

As illustrated in FIG. 7A, a plurality of transistors 704 are formed on a silicon substrate 702 (as part of second wafer 904, e.g., a silicon wafer). Transistors 704 can be formed by a plurality of processes including, but not limited to, photolithography, dry/wet etch, thin film deposition, thermal growth, implantation, CMP, and any other suitable processes. In some embodiments, doped regions are formed in silicon substrate 702 by ion implantation and/or thermal diffusion, which function, for example, as source regions and/or drain regions of transistors 704. In some embodiments, isolation regions (e.g., STIs) are also formed in silicon substrate 702 by wet/dry etch and thin film deposition.

As illustrated in FIG. 7B, a plurality of capacitors 706 are formed above and in contact with at least some of transistors 704, i.e., the DRAM selection transistors. Each capacitor 706 can be patterned by photography to be aligned with a respective DRAM selection transistor to form a 1T1C memory cell, for example, by electrically connecting one electrode of capacitor 706 with one node of the respective DRAM selection transistor. In some embodiments, bit lines 707 and common plates 709 are formed as well for electrically connecting the DRAM selection transistors and capacitors 706. Capacitors 706 can be formed by a plurality of processes including, but not limited to, photolithography, dry/wet etch, thin film deposition, thermal growth, implantation, CMP, and any other suitable processes. A device layer 708 including an array of DRAM cells 710 (each having a DRAM selection transistor and capacitor 706) and peripheral circuits 711 (having transistors 704 other than the DRAM selection transistors) is thereby formed.

Method 1100 proceeds to operation 1110, as illustrated in FIG. 11, in which a second interconnect layer is formed above the array of DRAM cells. The second interconnect layer can include a second plurality of interconnects in one or more ILD layers. As illustrated in FIG. 7C, an interconnect layer 714 can be formed above array of DRAM cells 710. Interconnect layer 714 can include interconnects of MEOL and/or BEOL in a plurality of ILD layers to make electrical connections with array of DRAM cells 710 (and peripheral circuits 711 if any). In some embodiments, interconnect layer 714 includes multiple ILD layers and interconnects therein formed in multiple processes. For example, the interconnects in interconnect layers 714 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 7C can be collectively referred to as interconnect layer 714.

Method 1100 proceeds to operation 1112, as illustrated in FIG. 11, in which a second bonding layer is formed above the second interconnect layer. The second bonding layer can include a plurality of second bonding contacts. As illustrated in FIG. 7C, a bonding layer 716 is formed above interconnect layer 714. Bonding layer 716 can include a plurality of bonding contacts 718 surrounded by dielectrics. In some embodiments, a dielectric layer is deposited on the top surface of interconnect layer 714 by one or more thin film deposition processes including, but not limited to, CVD, PVD, ALD, or any combination thereof. Bonding contacts 718 then can be formed through the dielectric layer and in contact with the interconnects in interconnect layer 714 by first patterning contact holes through the dielectric layer using patterning process (e.g., photolithography and dry/wet etch of dielectric materials in the dielectric layer). The contact holes can be filled with a conductor (e.g., copper). In some embodiments, filling the contact holes includes depositing an adhesion (glue) layer, a barrier layer, and/or a seed layer before depositing the conductor.

Method 1100 proceeds to operation 1114, as illustrated in FIG. 11, in which the first wafer and the second wafer are bonded in a face-to-face manner, such that the at least one of the first semiconductor structures is bonded to the at least one of the second semiconductor structures. The first bonding contacts of the first semiconductor structure are in contact with the second bonding contacts of the second semiconductor structure at a bonding interface. The bonding can be hybrid bonding. In some embodiments, the second semiconductor structure is above the first semiconductor structure after the bonding. In some embodiments, the first semiconductor structure is above the second semiconductor structure after the bonding.

As illustrated in FIG. 9B, first wafer 902 and second wafer 904 are bonded in a face-to-face manner, such that at least one of first semiconductor structures 906 is bonded to at least one of second semiconductor structures 908 at a bonding interface 909. Although first wafer 902 is above second wafer 904 after the bonding as shown in FIG. 9B, it is understood that second wafer 904 may be above first wafer 902 after the bonding in some embodiments. FIG. 8A illustrates one example of the formation of bonded first and second semiconductor structures 906 and 908.

As illustrated in FIG. 8A, silicon substrate 702 and components formed thereon (e.g., device layer 712 including array of DRAM cells 710) are flipped upside down. Bonding layer 716 facing down is bonded with bonding layer 616 facing up, i.e., in a face-to-face manner, thereby forming a bonding interface 802 (as shown in FIG. 8B). In some embodiments, a treatment process, e.g., a plasma treatment, a wet treatment, and/or a thermal treatment, is applied to the bonding surfaces prior to the bonding. Although not shown in FIG. 8A, silicon substrate 602 and components formed thereon (e.g., device layer 606 including processor 608, array of SRAM cells 610, and peripheral circuit 612) can be flipped upside down, and bonding layer 616 facing down can be bonded with bonding layer 716 facing up, i.e., in a face-to-face manner, thereby forming bonding interface 802. After the bonding, bonding contacts 718 in bonding layer 716 and bonding contacts 618 in bonding layer 616 are aligned and in contact with one another, such that device layer 712 (e.g., array of DRAM cells 710 therein) can be electrically connected to device layer 606 (e.g., processor 608, array of SRAM cells 610, and peripheral circuit 612 therein). It is understood that in the bonded chip, device layer 606 (e.g., processor 608, array of SRAM cells 610, and peripheral circuit 612 therein) may be either above or below device layer 712 (e.g., array of DRAM cells 710 therein). Nevertheless, bonding interface 802 can be formed between device layer 606 (e.g., processor 608, array of SRAM cells 610, and peripheral circuit 612 therein) and device layer 712 (e.g., array of DRAM cells 710 therein) after the bonding as illustrated in FIG. 8B. It is understood that although device layer 712 in FIG. 8A does not include peripheral circuits 711 (as shown in FIG. 7C), in some embodiments, peripheral circuits 711 may be included as part of device layer 712 in the bonded chip. It is further understood that although device layer 606 in FIG. 8A includes peripheral circuits 612, in some embodiments, peripheral circuits 612 may not be included as part of device layer 606 in the bonded chip.

Method 1100 proceeds to operation 1116, as illustrated in FIG. 11, in which the first wafer or the second wafer is thinned to form a semiconductor layer. In some embodiments, the first wafer of the first semiconductor structure, which is above the second wafer of the second semiconductor structure after the bonding, is thinned to form the semiconductor layer. In some embodiments, the second wafer of the second semiconductor structure, which is above the first wafer of the first semiconductor structure after the bonding, is thinned to form the semiconductor layer.

As illustrated in FIG. 8B, the substrate at the top of the bonded chip (e.g., silicon substrate 702 as shown in FIG. 8A) is thinned, so that the thinned top substrate can serve as a semiconductor layer 804, for example, a single-crystal silicon layer. The thickness of the thinned substrate can be between about 200 nm and about 5 μm, such as between 200 nm and 5 μm, or between about 150 nm and about 50 μm, such as between 150 nm and 50 μm. Silicon substrate 702 can be thinned by processes including, but not limited to, wafer grinding, dry etch, wet etch, CMP, any other suitable processes, or any combination thereof. It is understood that when silicon substrate 602 is the substrate at the top of the bonded chip, another semiconductor layer may be formed by thinning silicon substrate 602.

Method 1100 proceeds to operation 1118, as illustrated in FIG. 11, in which a pad-out interconnect layer is formed above the semiconductor layer. As illustrated in FIG. 8B, a pad-out interconnect layer 806 is formed above semiconductor layer 804 (the thinned top substrate). Pad-out interconnect layer 806 can include interconnects, such as pad contacts 808, formed in one or more ILD layers. Pad contacts 808 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some embodiments, after the bonding and thinning, contacts 810 are formed extending vertically through semiconductor layer 804, for example by wet/dry etch followed by depositing conductive materials. Contacts 810 can be in contact with the interconnects in pad-out interconnect layer 806.

Method 1100 proceeds to operation 1120, as illustrated in FIG. 11, in which the bonded first and second wafers are diced into a plurality of dies. At least one of the dies includes the bonded first and second semiconductor structures. As illustrated in FIG. 9C, bonded first and second wafers 902 and 904 (as shown in FIG. 9B) are diced into a plurality of dies 912. At least one of dies 912 includes bonded first and second semiconductor structures 906 and 908. In some embodiments, each shot of bonded first and second wafers 902 and 904 is cut from bonded first and second wafers 902 and 904 along the scribing lines using wafer laser dicing and/or mechanical dicing techniques, thereby becoming respective die 912. Die 912 can include bonded first and second semiconductor structures 906 and 908, for example, the bonded structure as shown in FIG. 8B.

Instead of packaging scheme based on wafer-level bonding before dicing as described above with respect to FIGS. 9A-9C and 11, FIGS. 10A-10C and 12 illustrate another packaging scheme based on die-level bonding after dicing, according to some embodiments. Operations 1102, 1104, and 1106 of method 1200 in FIG. 12 are described above with respect to method 1100 in FIG. 11 and thus, are not repeated. As illustrated in FIG. 10A, a plurality of first semiconductor structures 1006 are formed on a first wafer 1002. First wafer 1002 can include a plurality of shots separated by scribing lines. Each shot of first wafer 1002 includes one or more first semiconductor structures 1006, according to some embodiments. FIGS. 6A and 6B illustrate one example of the formation of first semiconductor structure 1006.

Method 1200 proceeds to operation 1202, as illustrated in FIG. 12, in which the first wafer is diced into a plurality of first dies, such that at least one of the first dies includes the at least one of the first semiconductor structures. As illustrated in FIG. 10B, first wafer 1002 (as shown in FIG. 10A) is diced into a plurality of dies 1010, such that at least one die 1010 includes first semiconductor structure 1006. In some embodiments, each shot of first wafer 1002 is cut from first wafer 1002 along the scribing lines using wafer laser dicing and/or mechanical dicing techniques, thereby becoming respective die 1010. Die 1010 can include first semiconductor structure 1006, for example, the structure as shown in FIG. 6B.

Operations 1108, 1110, and 1112 of method 1200 in FIG. 12 are described above with respect to method 1100 in FIG. 11 and thus, are not repeated. As illustrated in FIG. 10A, a plurality of second semiconductor structures 1008 are formed on a second wafer 1004. Second wafer 1004 can include a plurality of shots separated by scribing lines. Each shot of second wafer 1004 includes one or more second semiconductor structures 1008, according to some embodiments. FIGS. 7A-7C illustrate one example of the formation of second semiconductor structure 1008.

Method 1200 proceeds to operation 1204, as illustrated in FIG. 12, in which the second wafer is diced into a plurality of second dies, such that at least one of the second dies includes the at least one of the second semiconductor structures. As illustrated in FIG. 10B, second wafer 1004 (as shown in FIG. 10A) is diced into a plurality of dies 1012, such that at least one die 1012 includes second semiconductor structure 1008. In some embodiments, each shot of second wafer 1004 is cut from second wafer 1004 along the scribing lines using wafer laser dicing and/or mechanical dicing techniques, thereby becoming respective die 1012. Die 1012 can include second semiconductor structure 1008, for example, the structure as shown in FIG. 7C.

Method 1200 proceeds to operation 1206, as illustrated in FIG. 12, in which the first die and the second die are bonded in a face-to-face manner, such that the first semiconductor structure is bonded to the second semiconductor structure. The first bonding contacts of the first semiconductor structure are in contact with the second bonding contacts of the second semiconductor structure at a bonding interface. As illustrated in FIG. 10C, die 1010 including first semiconductor structure 1006 and die 1012 including second semiconductor structure 1008 are bonded in a face-to-face manner, such that first semiconductor structure 1006 is bonded to second semiconductor structure 1008 at a bonding interface 1014. Although first semiconductor structure 1006 is above second semiconductor structure 1008 after the bonding as shown in FIG. 10C, it is understood that second semiconductor structure 1008 may be above first semiconductor structure 1006 after the bonding in some embodiments. FIG. 8A illustrates one example of the formation of bonded first and second semiconductor structures 1006 and 1008.

Method 1200 proceeds to operation 1208, as illustrated in FIG. 12, in which the first wafer or the second wafer is thinned to form a semiconductor layer. In some embodiments, the first wafer of the first semiconductor structure, which is above the second wafer of the second semiconductor structure after the bonding, is thinned to form the semiconductor layer. In some embodiments, the second wafer of the second semiconductor structure, which is above the first wafer of the first semiconductor structure after the bonding, is thinned to form the semiconductor layer.

As illustrated in FIG. 8B, the substrate at the top of the bonded chip (e.g., silicon substrate 702 as shown in FIG. 8A) is thinned, so that the thinned top substrate can serve as a semiconductor layer 804, for example, a single-crystal silicon layer. The thickness of the thinned substrate can be between about 200 nm and about 5 μm, such as between 200 nm and 5 μm, or between about 150 nm and about 50 μm, such as between 150 nm and 50 μm. Silicon substrate 702 can be thinned by processes including, but not limited to, wafer grinding, dry etch, wet etch, CMP, any other suitable processes, or any combination thereof. It is understood that when silicon substrate 602 is the substrate at the top of the bonded chip, another semiconductor layer may be formed by thinning silicon substrate 602.

Method 1200 proceeds to operation 1210, as illustrated in FIG. 12, in which a pad-out interconnect layer is formed above the semiconductor layer. As illustrated in FIG. 8B, a pad-out interconnect layer 806 is formed above semiconductor layer 804 (the thinned top substrate). Pad-out interconnect layer 806 can include interconnects, such as pad contacts 808, formed in one or more ILD layers. Pad contacts 808 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some embodiments, after the bonding and thinning, contacts 810 are formed extending vertically through semiconductor layer 804, for example by wet/dry etch followed by depositing conductive materials. Contacts 810 can be in contact with the interconnects in pad-out interconnect layer 806.

According to one aspect of the present disclosure, a semiconductor device includes a first semiconductor structure including a processor, an array of SRAM cells, and a first bonding layer including a plurality of first bonding contacts. The semiconductor device also includes a second semiconductor structure including an array of DRAM cells and a second bonding layer including a plurality of second bonding contacts. The semiconductor device further includes a bonding interface between the first bonding layer and the second bonding layer. The first bonding contacts are in contact with the second bonding contacts at the bonding interface.

In some embodiments, the first semiconductor structure includes a substrate, the processor on the substrate, the array of SRAM cells on the substrate and outside of the processor, and the first bonding layer above the processor and the array of SRAM cells.

In some embodiments, the second semiconductor structure includes the second bonding layer above the first bonding layer, the array of DRAM cells above the second bonding layer, and a semiconductor layer above and in contact with the array of DRAM cells.

In some embodiments, the semiconductor device further includes a pad-out interconnect layer above the semiconductor layer. In some embodiments, the semiconductor layer includes single-crystal silicon.

In some embodiments, the second semiconductor structure includes a substrate, the array of DRAM cells on the substrate, and the second bonding layer above the array of DRAM cells.

In some embodiments, the first semiconductor structure includes the first bonding layer above the second bonding layer, the processor above the first bonding layer, the array of SRAM cells above the first bonding layer and outside of the processor, and a semiconductor layer above and in contact with the processor and the array of SRAM cells.

In some embodiments, the semiconductor device further includes a pad-out interconnect layer above the semiconductor layer. In some embodiments, the semiconductor layer includes single-crystal silicon.

In some embodiments, the first semiconductor structure further includes a peripheral circuit of the array of DRAM cells. In some embodiments, the second semiconductor structure further includes a peripheral circuit of the array of DRAM cells.

In some embodiments, the first semiconductor structure includes a first interconnect layer vertically between the first bonding layer and the processor, and the second semiconductor structure includes a second interconnect layer vertically between the second bonding layer and the array of DRAM cells.

In some embodiments, the processor is electrically connected to the array of DRAM cells through the first and second interconnect layers and the first and second bonding contacts.

In some embodiments, the array of SRAM cells are electrically connected to the array of DRAM cells through the first and second interconnect layers and the first and second bonding contacts.

In some embodiments, the array of SRAM cells are distributed in a plurality of separate regions in the first semiconductor structure.

In some embodiments, each DRAM cell includes a transistor and a capacitor.

According to another aspect of the present disclosure, a method for forming a semiconductor device is disclosed. A plurality of first semiconductor structures are formed on a first wafer. At least one of the first semiconductor structures includes a processor, an array of SRAM cells, and a first bonding layer including a plurality of first bonding contacts. A plurality of second semiconductor structures are formed on a second wafer. At least one of the second semiconductor structures includes an array of DRAM cells and a second bonding layer including a plurality of second bonding contacts. The first wafer and the second wafer in are bonded in a face-to-face manner, such that the at least one of the first semiconductor structures is bonded to the at least one of the second semiconductor structures. The first bonding contacts of the first semiconductor structure are in contact with the second bonding contacts of the second semiconductor structure at a bonding interface. The bonded first and second wafers are diced into a plurality of dies. At least one of the dies includes the bonded first and second semiconductor structures.

In some embodiments, to form the plurality of first semiconductor structures, the processor and the array of SRAM cells are formed on the first wafer, a first interconnect layer is formed above the processor and the array of SRAM cells, and the first bonding layer is formed above the first interconnect layer. In some embodiments, to form the processor and the array of SRAM cells, a plurality of transistors are formed on the first wafer.

In some embodiments, to form the plurality of first semiconductor structures, a peripheral circuit of the array of DRAM cells is formed on the first wafer.

In some embodiments, to form the plurality of second semiconductor structures, the array of DRAM cells are formed on the second wafer, a second interconnect layer is formed above the array of DRAM cells, and the second bonding layer is formed above the second interconnect layer.

In some embodiments, to form the array of DRAM cells, a plurality of transistors are formed on the second wafer, and a plurality of capacitors are formed above and in contact with at least some of the transistors.

In some embodiments, to form the plurality of second semiconductor structures, a peripheral circuit of the array of DRAM cells is formed on the second wafer.

In some embodiments, the second semiconductor structure is above the first semiconductor structure after the bonding. In some embodiments, after the bonding and prior to the dicing, the second wafer is thinned to form a semiconductor layer, and a pad-out interconnect layer is formed above the semiconductor layer.

In some embodiments, the first semiconductor structure is above the second semiconductor structure after the bonding. In some embodiments, after the bonding and prior to the dicing, the first wafer is thinned to form a semiconductor layer, and a pad-out interconnect layer is formed above the semiconductor layer.

In some embodiments, the bonding includes hybrid bonding.

According to still another aspect of the present disclosure, a method for forming a semiconductor device is disclosed. A plurality of first semiconductor structures are formed on a first wafer. At least one of the first semiconductor structures includes a processor, an array of SRAM cells, and a first bonding layer including a plurality of first bonding contacts. The first wafer is diced into a plurality of first dies, such that at least one of the first dies includes the at least one of the first semiconductor structures. A plurality of second semiconductor structures are formed on a second wafer. At least one of the second semiconductor structures includes an array of DRAM cells and a second bonding layer including a plurality of second bonding contacts. The second wafer is diced into a plurality of second dies, such that at least one of the second dies includes the at least one of the second semiconductor structures. The first die and the second die are bonded in a face-to-face manner, such that the first semiconductor structure is bonded to the second semiconductor structure. The first bonding contacts of the first semiconductor structure are in contact with the second bonding contacts of the second semiconductor structure at a bonding interface.

In some embodiments, to form the plurality of first semiconductor structures, the processor and the array of SRAM cells are formed on the first wafer, a first interconnect layer is formed above the processor and the array of SRAM cells, and the first bonding layer is formed above the first interconnect layer. In some embodiments, to form the processor and the array of SRAM cells, a plurality of transistors are formed on the first wafer.

In some embodiments, to form the plurality of first semiconductor structures, a peripheral circuit of the array of DRAM cells is formed on the first wafer.

In some embodiments, to form the plurality of second semiconductor structures, the array of DRAM cells are formed on the second wafer, a second interconnect layer is formed above the array of DRAM cells, and the second bonding layer is formed above the second interconnect layer.

In some embodiments, to form the array of DRAM cells, a plurality of transistors are formed on the second wafer, and a plurality of capacitors are formed above and in contact with at least some of the transistors.

In some embodiments, to form the plurality of second semiconductor structures, a peripheral circuit of the array of DRAM cells is formed on the second wafer.

In some embodiments, the second semiconductor structure is above the first semiconductor structure after the bonding. In some embodiments, the second wafer is thinned to form a semiconductor layer after the bonding, and a pad-out interconnect layer is formed above the semiconductor layer.

In some embodiments, the first semiconductor structure is above the second semiconductor structure after the bonding. In some embodiments, the first wafer is thinned to form a semiconductor layer after the bonding, and a pad-out interconnect layer is formed above the semiconductor layer.

In some embodiments, the bonding includes hybrid bonding.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a semiconductor device, comprising:

forming a plurality of first semiconductor structures on a first wafer, wherein at least one of the first semiconductor structures comprises a processor, an array of static random-access memory (SRAM) cells, and a first bonding layer comprising a plurality of first bonding contacts;

forming a plurality of second semiconductor structures on a second wafer, wherein at least one of the second semiconductor structures comprises an array of dynamic random-access memory (DRAM) cells and a second bonding layer comprising a plurality of second bonding contacts;

bonding the first wafer and the second wafer in a face-to-face manner, such that the at least one of the first semiconductor structures is bonded to the at least one of the second semiconductor structures, wherein the first bonding contacts of the first semiconductor structure are in contact with the second bonding contacts of the second semiconductor structure at a bonding interface; and dicing the bonded first and second wafers into a plurality of dies, wherein at least one of the dies comprises the bonded first and second semiconductor structures, wherein the at least one of the first semiconductor structures further comprises a peripheral circuit comprising an input/output buffer, a decoder, and a sense amplifier configured to facilitate operations of the array of DRAM cells in the at least one of the second semiconductor structures.

2. The method of claim 1, wherein forming the plurality of first semiconductor structures comprises:
   forming the processor and the array of SRAM cells on the first wafer;
   forming a first interconnect layer above the processor and the array of SRAM cells; and
   forming the first bonding layer above the first interconnect layer.

3. The method of claim 2, wherein forming the processor and the array of SRAM cells comprises forming a plurality of transistors on the first wafer.

4. The method of claim 2, wherein forming the plurality of first semiconductor structures further comprises forming a peripheral circuit of the array of DRAM cells on the first wafer.

5. The method of claim 1, wherein forming the plurality of second semiconductor structures comprises:
   forming the array of DRAM cells on the second wafer;
   forming a second interconnect layer above the array of DRAM cells; and
   forming the second bonding layer above the second interconnect layer.

6. The method of claim 5, wherein forming the array of DRAM cells comprises:
   forming a plurality of transistors on the second wafer; and
   forming a plurality of capacitors above and in contact with at least some of the transistors.

7. The method of claim 5, wherein forming the plurality of second semiconductor structures further comprises forming a peripheral circuit of the array of DRAM cells on the second wafer.

8. The method of claim 1, wherein the second semiconductor structure is above the first semiconductor structure after the bonding.

9. The method of claim 8, further comprising, after the bonding and prior to the dicing:
   thinning the second wafer to form a semiconductor layer; and
   forming a pad-out interconnect layer above the semiconductor layer.

10. The method of claim 1, wherein the first semiconductor structure is above the second semiconductor structure after the bonding.

11. The method of claim 10, further comprising, after the bonding and prior to the dicing:
    thinning the first wafer to form a semiconductor layer; and
    forming a pad-out interconnect layer above the semiconductor layer.

12. The method of claim 1, wherein the bonding comprises hybrid bonding.

13. A method for forming a semiconductor device, comprising:
    forming a plurality of first semiconductor structures on a first wafer, wherein at least one of the first semiconductor structures comprises a processor, an array of static random-access memory (SRAM) cells, and a first bonding layer comprising a plurality of first bonding contacts;
    dicing the first wafer into a plurality of first dies, such that at least one of the first dies comprises the at least one of the first semiconductor structures;
    forming a plurality of second semiconductor structures on a second wafer, wherein at least one of the second semiconductor structures comprises an array of dynamic random-access memory (DRAM) cells and a second bonding layer comprising a plurality of second bonding contacts;
    dicing the second wafer into a plurality of second dies, such that at least one of the second dies comprises the at least one of the second semiconductor structures; and
    bonding the first die and the second die in a face-to-face manner, such that the first semiconductor structure is bonded to the second semiconductor structure, wherein the first bonding contacts of the first semiconductor structure are in contact with the second bonding contacts of the second semiconductor structure at a bonding interface,
    wherein the at least one of the first semiconductor structures further comprises a peripheral circuit comprising an input/output buffer, a decoder, and a sense amplifier configured to facilitate operations of the array of DRAM cells in the at least one of the second semiconductor structures.

14. The method of claim 13, wherein forming the plurality of first semiconductor structures comprises:
    forming the processor and the array of SRAM cells on the first wafer;
    forming a first interconnect layer above the processor and the array of SRAM cells; and
    forming the first bonding layer above the first interconnect layer.

15. The method of claim 13, wherein forming the plurality of second semiconductor structures comprises:
    forming the array of DRAM cells on the second wafer;
    forming a second interconnect layer above the array of DRAM cells; and
    forming the second bonding layer above the second interconnect layer.

16. The method of claim 13, wherein the second semiconductor structure is above the first semiconductor structure after the bonding.

17. The method of claim 16, further comprising:
    thinning the second wafer to form a semiconductor layer after the bonding; and forming a pad-out interconnect layer above the semiconductor layer.

18. The method of claim 13, wherein the first semiconductor structure is above the second semiconductor structure after the bonding.

19. The method of claim 18, further comprising:
  thinning the first wafer to form a semiconductor layer after the bonding; and
  forming a pad-out interconnect layer above the semiconductor layer.

20. The method of claim 13, wherein the bonding comprises hybrid bonding.

* * * * *